US012707741B2

(12) United States Patent
Okano et al.

(10) Patent No.: US 12,707,741 B2
(45) Date of Patent: Aug. 11, 2026

(54) IMAGING ELEMENT AND SEMICONDUCTOR CHIP

(71) Applicant: SONY SEMICONDUCTOR SOLUTIONS CORPORATION, Kanagawa (JP)

(72) Inventors: Hitoshi Okano, Kanagawa (JP); Kan Shimizu, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 537 days.

(21) Appl. No.: 17/908,658

(22) PCT Filed: Mar. 3, 2021

(86) PCT No.: PCT/JP2021/008045
§ 371 (c)(1),
(2) Date: Sep. 1, 2022

(87) PCT Pub. No.: WO2021/187092
PCT Pub. Date: Sep. 23, 2021

(65) Prior Publication Data

US 2023/0095332 A1 Mar. 30, 2023

(30) Foreign Application Priority Data

Mar. 17, 2020 (JP) ................................ 2020-046017

(51) Int. Cl.
*H10F 39/00* (2025.01)
*H10F 39/18* (2025.01)
(Continued)

(52) U.S. Cl.
CPC ........... *H10F 39/805* (2025.01); *H10F 39/18* (2025.01); *H10F 39/809* (2025.01); *H10W 72/20* (2026.01);
(Continued)

(58) Field of Classification Search
CPC ........... H01L 27/1462; H01L 27/14634; H01L 27/14643; H01L 2224/05573;
(Continued)

(56) References Cited

U.S. PATENT DOCUMENTS 6,480,226 B1 * 11/2002 Takahashi ........... H10F 39/1536
348/E5.037
10,367,022 B2 * 7/2019 Kobayashi .......... H01L 27/1464
(Continued)

FOREIGN PATENT DOCUMENTS

JP 2009-088430 4/2009
JP 2012-084693 4/2012
(Continued)

OTHER PUBLICATIONS

International Search Report and Written Opinion prepared by the Japan Patent Office on May 18, 2021, for International Application No. PCT/JP2021/008045, 2 pgs.

*Primary Examiner* — Jeff W Natalini
*Assistant Examiner* — Andrew John Zabel
(74) *Attorney, Agent, or Firm* — SHERIDAN ROSS P.C.

(57) ABSTRACT

The present technology relates to an imaging element and a semiconductor chip that can implement a low height of the imaging element. A first chip including a photo diode; and a second chip including a circuit processing a signal transmitted from the photo diode are stacked, and a charging film is disposed on a second face of the second chip that is on a side opposite to a first face on which the first chip is stacked. The charging film is disposed in a part or the entirety of the second face. For example, the present technology can be applied to an imaging element, in which a plurality of chips are configured to be stacked, that can implement a low height and a small size.

16 Claims, 26 Drawing Sheets

(51) Int. Cl.

| | |
|---|---|
| *H10W 72/20* | (2026.01) |
| *H10W 72/90* | (2026.01) |
| *H10W 90/00* | (2026.01) |

(52) U.S. Cl.

CPC .......... *H10W 72/90* (2026.01); *H10W 72/952* (2026.01); *H10W 90/724* (2026.01); *H10W 90/792* (2026.01)

(58) Field of Classification Search

CPC . H01L 2224/05647; H01L 2224/08145; H01L 2224/16225; H01L 24/05; H01L 24/08; H01L 24/13; H01L 24/16

See application file for complete search history.

(56) References Cited

U.S. PATENT DOCUMENTS

| | | | | |
|---|---|---|---|---|
| 10,446,601 | B2 * | 10/2019 | Otake | H10F 39/8027 |
| 2010/0187679 | A1 * | 7/2010 | Hayashi | H01L 23/49838 257/692 |
| 2012/0086094 | A1 | 4/2012 | Watanabe | |
| 2013/0280848 | A1 | 10/2013 | Watanabe | |
| 2014/0110789 | A1 * | 4/2014 | Koketsu | H01L 23/535 257/368 |
| 2015/0035109 | A1 * | 2/2015 | Kataoka | H01L 24/06 257/443 |
| 2016/0276397 | A1 | 9/2016 | Arakawa | |
| 2017/0025383 | A1 * | 1/2017 | Kato | H01L 23/481 |
| 2017/0033085 | A1 * | 2/2017 | Shikibu | H01L 23/49541 |
| 2017/0033144 | A1 * | 2/2017 | Takahashi | H01L 27/14638 |
| 2017/0141144 | A1 | 5/2017 | Yamakawa et al. | |
| 2017/0179181 | A1 * | 6/2017 | Kwon | H01L 25/0657 |
| 2017/0263665 | A1 * | 9/2017 | Komai | H01L 23/481 |
| 2018/0033731 | A1 * | 2/2018 | Betsui | H01L 23/5386 |
| 2018/0204827 | A1 * | 7/2018 | Betsui | H01L 24/16 |
| 2019/0363129 | A1 | 11/2019 | Yokoyama et al. | |
| 2019/0386052 | A1 * | 12/2019 | Furuhashi | H01L 24/80 |

FOREIGN PATENT DOCUMENTS

| | | |
|---|---|---|
| JP | 2016-021520 | 2/2016 |
| JP | 2016-174038 | 9/2016 |
| JP | 2018-117102 | 9/2016 |

* cited by examiner

A
B
C
600c
611
621
622c
601c
602c
622c
612c-1
612c-2
612c-3
623-1
623-2
623-3
601c
602c 600d
611
612d
621
601d
612d
602d
623-3
623-2
623-1
622d-3
622d-2
622d-1
601d
602d
A
B
C

IMAGING ELEMENT AND SEMICONDUCTOR CHIP

CROSS REFERENCE TO RELATED APPLICATIONS

This application is a national stage application under 35 U.S.C. 371 and claims the benefit of PCT Application No. PCT/JP2021/008045, having an international filing date of 3 Mar. 2021, which designated the United States, which PCT application claimed the benefit of Japanese Patent Application No. 2020-046017, filed 17 Mar. 2020, the entire disclosures of each of which are incorporated herein by reference.

TECHNICAL FIELD

The present technology relates to an imaging element and a semiconductor chip and, for example, relates to an imaging element and a semiconductor chip capable of being reduced in height.

BACKGROUND ART

Conventionally, in a device using a semiconductor substrate, for the purpose of inhibiting increases in a chip area, wiring resistance, power consumption, and the like, a structure in which a plurality of semiconductor substrates are stacked has been proposed (for example, see PTL 1).

As a technique for stacking a plurality of semiconductor substrates, a method in which, first, a plurality of semiconductor substrates are stacked to be electrically connected to each other in a wafer process, the semiconductor substrates are then divided into a chip size is known. Actually, CMOS image sensors formed from a logic substrate and a sensor substrate are produced using the technique described above, and there are CMOS image sensors and the like in which three or more semiconductor substrates are stacked.

CITATION LIST

Patent Literature

[PTL 1]
JP 2009-88430A

SUMMARY

Technical Problem

However, in a case in which a semiconductor device is formed by stacking a plurality of semiconductor substrates, it is preferable to configure the layer thickness to be thin. It is preferable to realize implementation of thinning, a low height, and a small size of a semiconductor substrate by thinning the layer thickness.

The present technology has been made in view of such a situation and makes it possible to implement thinning, a low height, and a small size of a semiconductor substrate.

Solution to Problem

In a first imaging element according to one aspect of the present technology, a first chip including a photodiode and a second chip including a circuit processing a signal transmitted from the photodiode are stacked, and a charging film is disposed on a second face of the second chip that is on a side opposite to a first face on which the first chip is stacked.

According to one aspect of the present technology, there is provided a semiconductor chip that is a chip of which a thickness is equal to or smaller than 20 um, and a charging film is disposed on a predetermined face of the chip.

In a second imaging element according to one aspect of the present technology, a first chip including a photo diode, a second chip including a circuit processing a signal transmitted from the photo diode; and a third chip having a memory function or an AI function are stacked, and a charging film is disposed on a second face of the third chip that is on a side opposite to a first face, on which the second chip is stacked.

In the first imaging element according to one aspect of the present technology, a first chip including a photo diode and a second chip including a circuit processing a signal transmitted from the photo diode may be stacked, and a charging film may be disposed on a second face of the second chip that is on a side opposite to a first face on which the first chip is stacked.

The semiconductor chip according to one aspect of the present technology is a chip of which a thickness is equal to or smaller than 20 um, and a charging film is disposed on a predetermined face of the chip.

In the second imaging element according to one aspect of the present technology, a first chip including a photo diode, a second chip including a circuit processing a signal transmitted from the photo diode; and a third chip having a memory function or an AI function are stacked, and a charging film is disposed on a second face of the third chip that is on a side opposite to a first face, on which the second chip is stacked.

DESCRIPTION OF EMBODIMENTS

Hereinafter, modes for carrying out the present technique (hereinafter referred to as "embodiments") will be described.

Since the present technique can be applied to an imaging device, here, a case in which the present technique is applied to an imaging device will be described as an example. In addition, although an imaging device will be described below as an example herein, the present technique is not limited to an application to an imaging device and can be applied to all electronic devices that use an imaging device as an image capturing unit (photoelectric conversion unit), for example, imaging devices such as digital still cameras and video cameras, mobile terminal devices having an imaging function such as mobile phones, and copiers that use an imaging device as an image reading unit. Also, there is also a mode of a module type being mounted in an electronic device, that is, a case in which a camera module is used as an imaging device.

Figure 1:
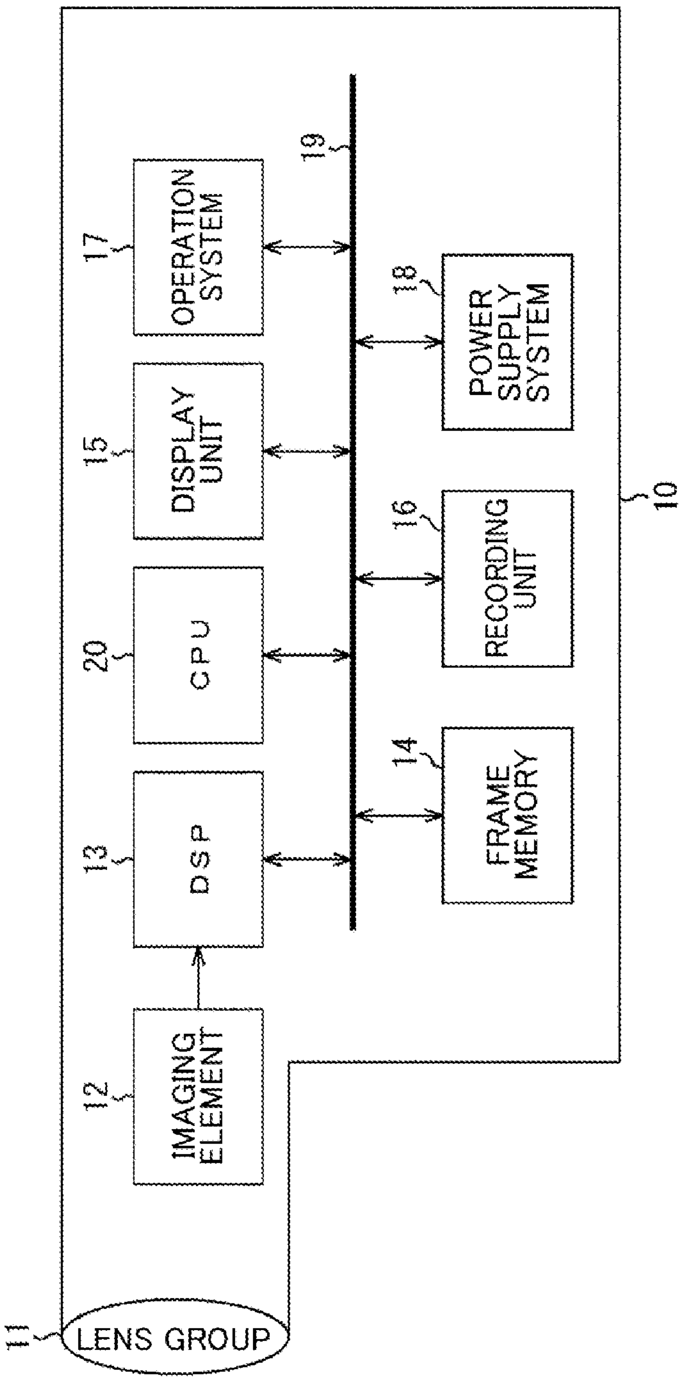
FIG. 1 is a diagram showing a configuration example of an imaging device.

FIG. 1 is a block diagram showing a configuration example of an imaging device which is an example of an electronic device according to the present disclosure. As shown in FIG. 1, the imaging device 10 has an optical system including a lens group 11 and the like, an imaging element 12, a DSP circuit 13 that is a camera signal processing unit, a frame memory 14, a display unit 15, a recording unit 16, an operation system 17, a power supply system 18, and the like.

In addition, the DSP circuit 13, the frame memory 14, the display unit 15, the recording unit 16, the operation system 17, and the power supply system 18 are configured to be connected to each other via a bus line 19. The CPU 20 controls each unit in the imaging device 10.

The lens group 11 captures incident light (image light) from a subject and forms an image on an imaging surface of the imaging element 12. The imaging element 12 converts a light amount of the incident light imaged on the imaging surface by the lens group 11 into an electric signal for each pixel and outputs the electric signal as a pixel signal. As the imaging element 12, an imaging element (image sensor) including pixels described below can be used.

The display unit 15 includes a panel-type display unit such as a liquid crystal display unit or an organic electro luminescence (EL) display unit and displays a video or a still image captured by the imaging element 12. The recording unit 16 records a video or a still image captured by the imaging element 12 on a recording medium such as a video tape or a digital versatile disk (DVD).

The operation system 17 issues operation commands for various functions of the present imaging device on the basis of operations of a user. The power supply system 18 appropriately used for various power supplies serving as operation power supplies for the DSP circuit 13, the frame memory 14, the display unit 15, the recording unit 16, and the operation system 17 as supply targets.

<Configuration of Imaging Element>

Figure 2:
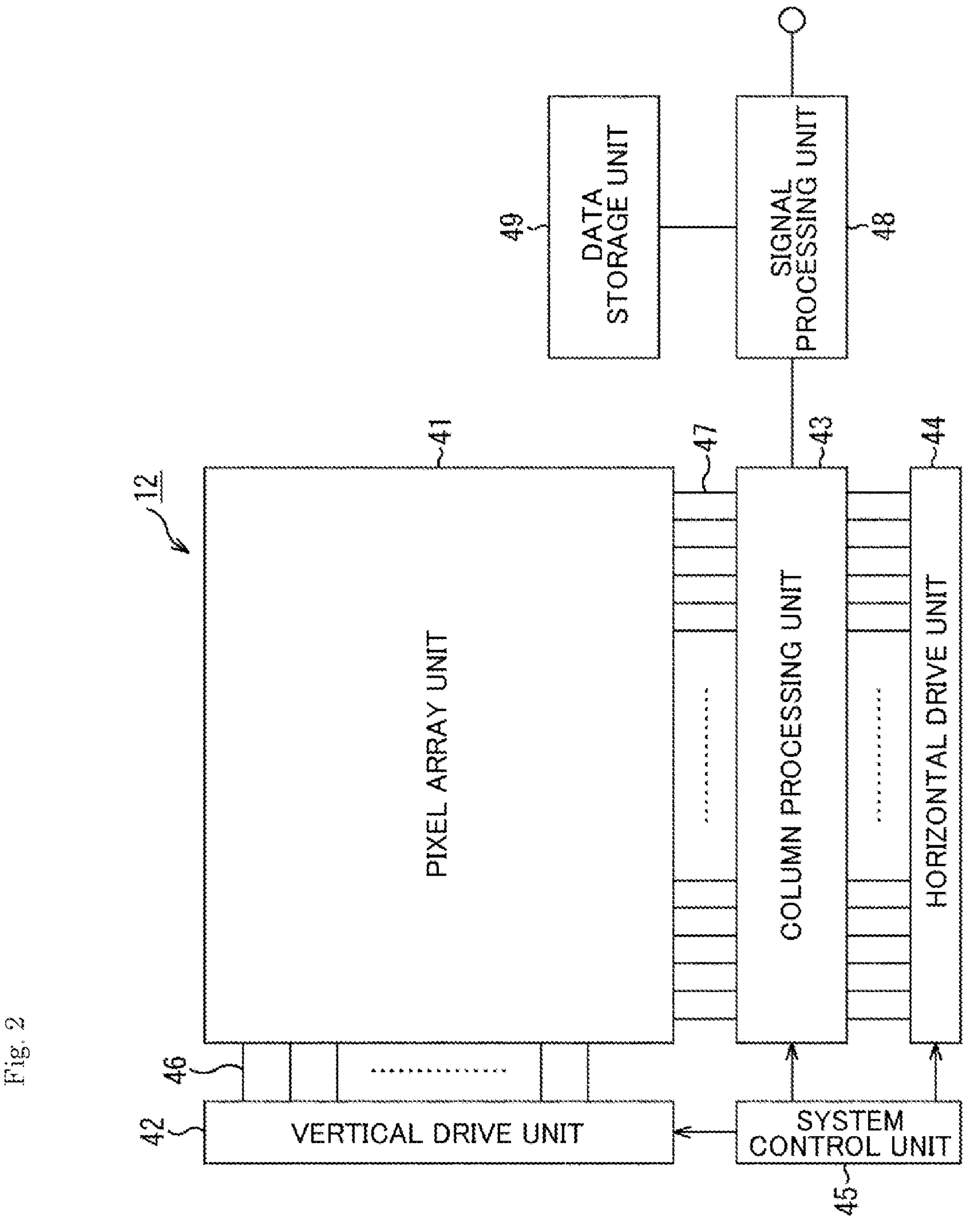
FIG. 2 is a diagram showing a configuration example of an imaging element.

FIG. 2 is a block diagram showing a configuration example of the imaging element 12. The imaging element 12 can be configured using a complementary metal oxide semiconductor (CMOS) image sensor.

The imaging element 12 is including a pixel array unit 41, a vertical drive unit 42, a column processing unit 43, a horizontal drive unit 44, and a system control unit 45. The pixel array unit 41, the vertical drive unit 42, the column processing unit 43, the horizontal drive unit 44, and the system control unit 45 are formed on a semiconductor substrate (chip) (not shown).

In the pixel array unit 41, unit pixels each having a photoelectric conversion element that generates a photocharge of a charge amount according to an amount of incident light and accumulates the photocharge therein are arranged two-dimensionally in a matrix. Also, hereinafter, photocharge having an amount of charge corresponding to the amount of incident light may be simply referred to as "charge", and the unit pixel may be simply referred to as a "pixel".

Furthermore, in the pixel array unit 41, for the matrix of pixel arrays, a pixel drive line 46 is formed for each row in the lateral direction in the drawing (the direction in which the pixels are arranged in a pixel row), and a vertical signal line 47 is formed for each column in a longitudinal direction in the drawing (the direction in which the pixels are arranged in a pixel column). One end of each pixel drive line 46 is connected to an output end corresponding to each row of the vertical drive unit 42.

The imaging element 12 further includes a signal processing unit 48 and a data storage unit 49. The signal processing unit 48 and the data storage unit 49 may be realized by an external signal processing unit provided on a substrate separately from the imaging element 12, for example, via a process using a digital signal processor (DSP) or software, and may be mounted on the same substrate along with the imaging element 12.

The vertical drive unit 42 is a pixel drive unit that is configured to have a shift register, an address decoder, or the like and drives all the pixels of the pixel array unit 41 simultaneously or in units of rows. Although not specifically shown in the figure, the vertical drive unit 42 is configured to have a reading scanning system, a sweep scanning system, or a batch sweep and batch transfer.

The reading scanning system selectively scans unit pixels of the pixel array unit 41 in sequence to read signals from the unit pixels in units of rows. In the case of row driving (a rolling shutter operation), for sweep, sweep scanning is performed at a time prior to readout scanning according to a shutter speed on a readout row on which the readout scanning is performed by the readout scanning system. In the case of global exposure (a global shutter operation), batch sweeping is performed at a time prior to batch transfer according to the shutter speed.

Due to this sweeping, unnecessary charge is swept (reset) from the photoelectric conversion element of the unit pixels in the read row. Then, a so-called electronic shutter operation is performed by sweeping (resetting) the unnecessary charge. Here, the electronic shutter operation is an operation of discarding photocharge of the photoelectric conversion element and newly starting exposure (starting accumulation of the photocharge).

The signal read by a read operation using the reading scanning system corresponds to an amount of light incident after an immediately previous read operation or an electronic shutter operation. In the case of the row driving, a period from a readout timing in the immediately previous readout operation or a sweep timing in the electronic shutter operation to a readout timing in a current readout operation is a photocharge accumulation period (an exposure period) in the unit pixel. In the case of the global exposure, a period from batch sweep to batch transfer is an accumulation period (an exposure period).

A pixel signal output from each unit pixel in a pixel row selectively scanned by the vertical drive unit 42 is supplied to the column processing unit 43 through each vertical signal line 47. The column processing unit 43 performs, for each pixel column of the pixel array unit 41, predetermined signal processing on the pixel signal output from each unit pixel in a selected row through the vertical signal line 47 and temporarily holds the pixel signal after the signal processing.

Specifically, the column processing unit 43 performs at least noise removal processing, for example, correlated double sampling (CDS) processing, as the signal processing. Reset noise or fixed pattern noise specific to the pixels, such as a variance in a threshold value of the amplification transistor is removed through the correlated double sampling of the column processing unit 43. In addition to the noise removal processing, the column processing unit 43 can also be caused to have, for example, an analog-digital (AD) conversion function and output a signal level as a digital signal.

The horizontal drive unit 44 is configured with a shift register, an address decoder, or the like and selects the unit circuits corresponding to the pixel column of the column processing unit 43 in sequence. By this selective scanning performed by the horizontal drive unit 44, pixel signals processed by the column processing unit 43 are sequentially output to the signal processing unit 48.

The system control unit 45 is configured with a timing generator or the like generating various timing signals and performs driving control of the vertical drive unit 42, the column processing unit 43, the horizontal drive unit 44, and the like based on the various timing signals generated by the timing generator.

The signal processing unit 48 has at least an addition processing function and performs a variety of signal processing such as addition processing on the pixel signals output from the column processing unit 43. The data storage unit 49 temporarily stores data necessary for the signal processing in the signal processing unit 48.

First Embodiment

Figure 3:
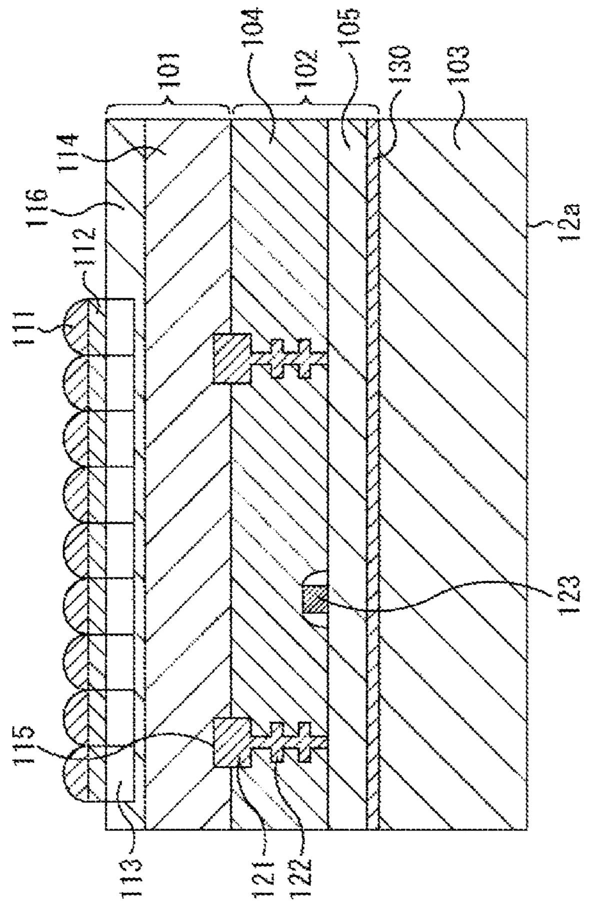
FIG. 3 is a cross-sectional view of an imaging element, to which the present technology is applied, according to a first embodiment.

FIG. 3 shows a configuration example of a cross-section of an imaging element 12 according to a first embodiment (referred to as an imaging element 12*a*). The imaging element 12*a* has a configuration in which a CMOS image sensor (CIS) chip 101, a logic chip 102, and a support base 103 are stacked in order from the top in the drawing. In the drawing, the upper side is a light incident face side, and the CIS chip 101 is stacked on the light incident surface side.

For example, the CIS chip 101 is a chip in which the pixel array unit 41 illustrated in FIG. 2 is included. The CIS chip 101 is composed of a photo diode layer 116 in which a plurality of photo diodes 113 formed on a silicon substrate are formed and a wiring layer 114. In addition, on the light incident face side of the CIS chip 101, on-chip lenses 111 and color filters 112 are stacked.

In the logic chip 102, logic circuits, memories, and the like are formed. For example, the logic circuits are the system control unit 45 and the signal processing unit 48 (FIG. 2). The logic chip 102 and the CIS chip 101 are connected using pads formed in the chips. For example, pads 121 are formed on a side on which the CIS chip 101 is stacked in the logic chip 102. In addition, pads 115 are formed on a side on which the logic chip 102 is stacked in the CIS chip 101.

For example, the pads 115 and the pads 121 are formed using conductors of copper (Cu) or the like. The pads 115 are electrically connected to predetermined parts of circuits formed in the CIS chip 101, for example, wirings and the like used for reading signals from the photo diodes 113. The pads 121 are electrically connected to logic circuits formed in the logic chip 102.

In addition, as illustrated in FIG. 3, the pad 115 and the pad 121 corresponding to each other are formed at mutual contact positions in a state in which the CIS chip 101 and the logic chip 102 are stacked. In other words, a circuit formed in the CIS chip 101 and a circuit formed in the logic chip 102 are electrically connected to each other through the pad 115 and the pad 121.

The number of the pads 115 and the pads 121 formed in the imaging element 12*a* is arbitrary.

As illustrated in FIG. 3, a wiring 122, a transistor 123, and the like are formed in the logic chip 102. For example, on an upper side of the silicon substrate 105 composed of silicon (Si) (the CIS chip 101 side) in the logic chip 102, a multi-layer wiring layer 104 is formed. In this multi-layer wiring layer 104, the system control unit 45, the signal processing unit 48, and the like illustrated in FIG. 2 are configured. In the multi-layer wiring layer 104, a plurality of wiring layers are formed, and an inter-layer insulating film is formed between the wiring layers.

The pad 121 is connected to the wiring 122. In addition, the pad 121 and the wiring 122 formed in a predetermined wiring layer are connected using a via formed in a vertical direction. In FIG. 3, although (a gate) of one transistor 123 is illustrated, a plurality of transistors are formed.

In the logic chip 102, a charging film 130 is formed on a side on which the support base 103 is stacked, that is, a face on a side opposite to a face on which the CIS chip 101 is stacked (the silicon substrate 105 side).

In the first embodiment, although description of the example in which the charging film 130 is formed only in the silicon substrate 105 of the logic chip 102 will be continued, the charging film 130 may be formed also on a side face of the logic chip 102.

When the logic chip 102 is manufactured, the charging film 130 is provided such that an adverse effect due to a defect, for example, formed in a case in which the logic chip 102 is thinned does not occur. This will be described with reference to FIG. 4.

Figure 4:
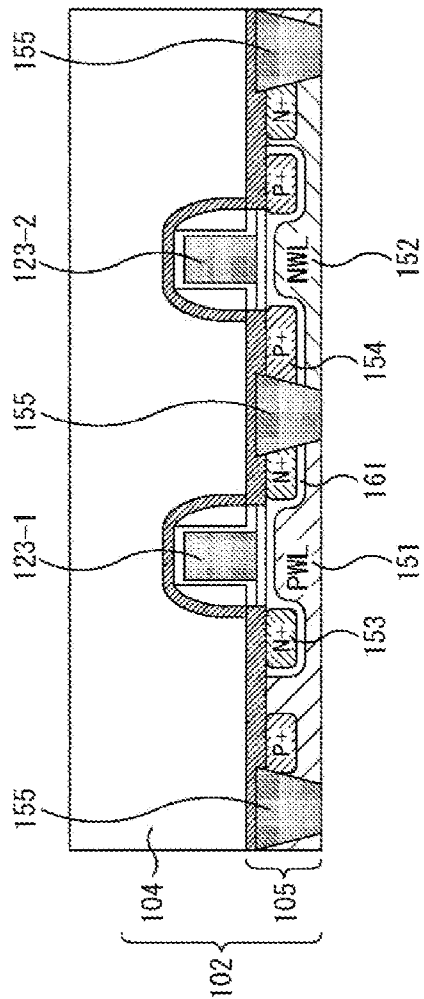
FIG. 4 is a diagram for explaining a layer in which transistors are formed.
Figure 5:
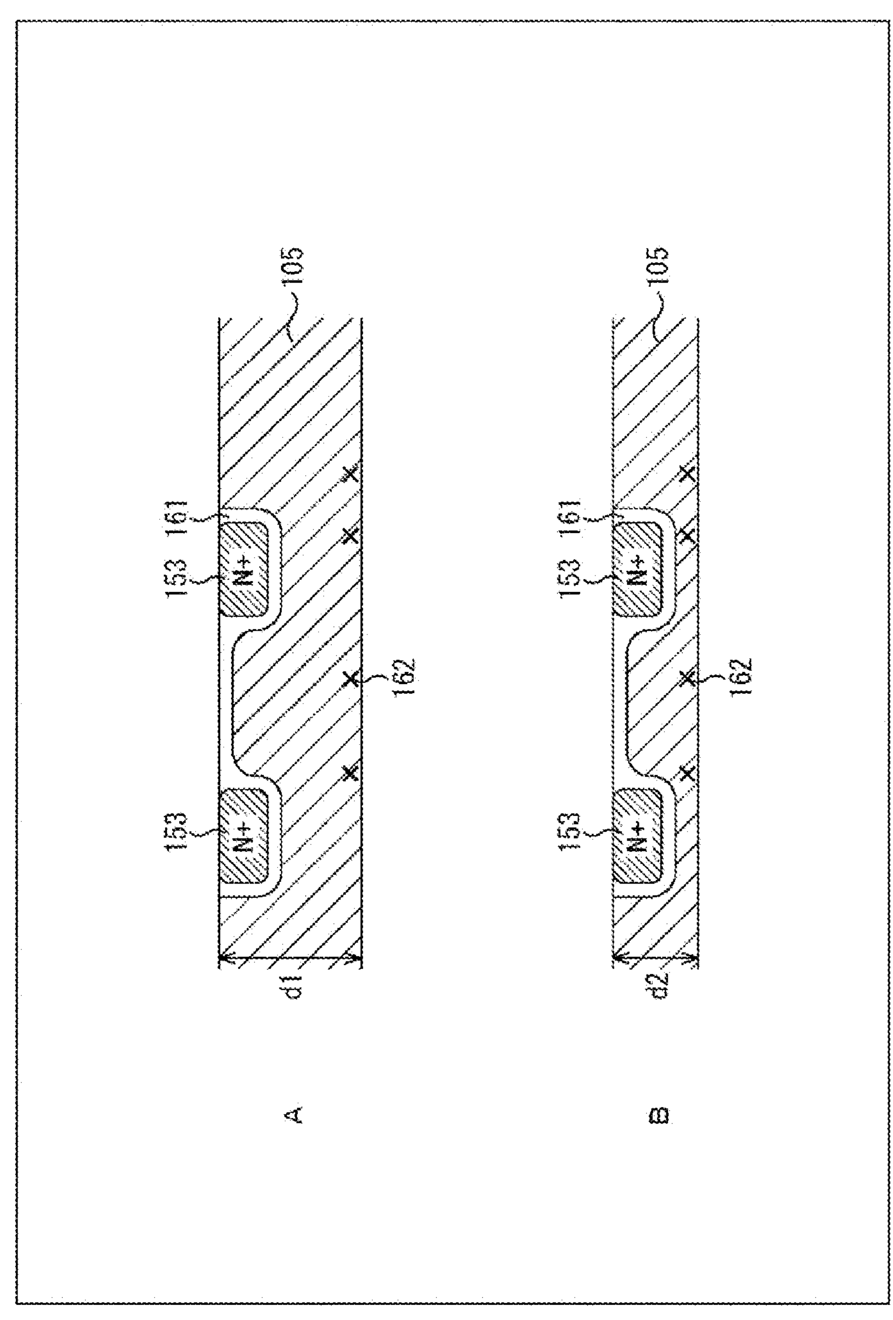
FIG. 5 is a diagram for explaining occurrence of leakage due to a defect.

FIG. 4 is a diagram in which an area in which the transistor 123 is formed is enlarged. In FIG. 4, in the logic chip 102, an area in which a gate part of the transistor 123 is formed will be referred to as a gate formation layer 104, and an area in which a source and a drain of the transistor 123 are formed will be referred to as a source/drain formation layer 105. In FIGS. 4 and 5, the multi-layer wiring layer 104 will be described as the gate formation layer 104, and the silicon substrate 105 will be described as the source/drain formation layer 105.

In the logic chip 102, an N-type transistor 123-1 and a P-type transistor 123-2 are formed. In the source/drain formation layer 105, a P well 151 and an N well 152 are formed. The N-type transistor 123-1 is formed in the P well 151, and the P-type transistor 123-2 is formed in the N well 152.

In the source/drain formation layer 105, N+ diffusion layers 153 are formed. The N+ diffusion layers 153 are formed to the left and right sides (of the gate) of the N-type transistor 123-1, and one thereof functions as a source, and the other thereof functions as a drain. In addition, P+ diffusion layers 154 are formed in the source/drain formation layer 105. The P+ diffusion layers 154 are formed to the left and right sides (of the gate) of the P-type transistor 123-2, and one thereof functions as a source, and the other thereof functions as a drain.

In addition, an element separation area 155 is formed in the source/drain formation layer 105. As illustrated in FIG. 4, the element separation area 155 is formed to pass through the source/drain formation layer 105 that is a semiconductor layer in which transistors (for example, an N-type transistor 123-1 and the P-type transistor 123-2) are formed. The element separation area 155 is composed of an arbitrary insulator.

In a PN junction part of a semiconductor, a depletion layer is formed. For example, in a part in which the P well 151 and the N+ diffusion layer 153 are in contact with each other and a part in which the N well 152 and the P+ diffusion layer 154 are in contact with each other, a depletion layer 161 is formed.

In a case in which the depletion layer 161 spreads up to a position near a defect formed in the source/drain formation layer 105 or spreads up to a position of being in contact with a defect, there is a possibility of a leakage current flowing from the depletion layer 161 to the defect and from the defect to the depletion layer 161. This will be described with reference to FIG. 5.

FIG. 5 is an enlarged view of the part of the source/drain formation layer 105. FIG. 5 shows cases in which thicknesses of logic chips 102 are different from each other and shows cases in which the thickness of the logic chip 102 illustrated in B of FIG. 5 is formed to be thinner than that of the logic chip 102 illustrated in A of FIG. 5.

A of FIG. 5 will be referred to. The logic chip 102 illustrated in A of FIG. 5 shows a case in which thinning is performed until the thickness of the source/drain formation layer 105 becomes a thickness d1. For example, in the case of a thickness d1 for which a state in which the N+ diffusion layer 153 (the depletion layer 161) and a defect 162 formed in the source/drain formation layer 105 are sufficiently separate from each other can be secured, occurrence of leakage between the N+ diffusion layer 153 and the depletion layer 161 via the defect 162 can be prevented.

The logic chip 102 illustrated in B of FIG. 5 shows a case in which thinning is performed until the thickness of the source/drain formation layer 105 becomes a thickness d2. The thickness d2 is a thickness satisfying the thickness d1>the thickness d2. For example, in the case of a thickness d2 for which a state in which the N+ diffusion layer 153 (the depletion layer 161) and a defect 162 formed in the source/drain formation layer 105 are sufficiently separate from each other cannot be secured, there is a possibility of leakage between the N+ diffusion layer 153 and the depletion layers 161 occurring via the defect 162.

For example, in a thinning process at the time of manufacturing the logic chip 102, there are cases in which the defect 162 is formed. In addition, in a case in which the logic chip 102 is thinned until the thickness becomes the thickness d2, as described above, there is a possibility of leakage via the defect 162 increasing. When such an increase in the leakage occurs, a product is handled as a defective product at the time of manufacturing.

From such a point, the thickness of the logic chip 102 needs to be a thickness of a certain degree. However, when the logic chip 102 is able to be formed to be thin, implementation of a low height and a small size of the imaging element 12 can be realized.

Thus, as described with reference to FIG. 3, the charging film 130 is formed in the logic chip 102. The charging film 130 functions as a film that captures generated electrons. Even when leakage occurs, the charging film 130 is configured as a film that can capture leaking electrons. By forming such a charging film 130 in the source/drain formation layer 105, an increase in leakage between wells via the defect 162 can be suppressed.

By disposing the charging film 130, even when the thickness of the logic chip 102 is formed to be thin, occurrence (increase) of leakage between wells via the defect 162 can be suppressed. Thus, even when the thickness of the logic chip 102 is formed to be thin, the possibility of the logic chip 102 being a defective product can be lowered. Thus, the logic chip 102 can be formed to be thin, and the imaging element **12*a* including such a logic chip 102** can be lowered in height and decreased in size.

For example, the thickness of the source/drain formation layer 105 can be formed to be equal to or smaller than 20 um. According to the present technology, even when the thickness of the source/drain formation layer 105 is formed to be equal to or smaller than 20 um, occurrence (increase) of leakage can be prevented.

The thickness of the source/drain formation layer 105 can be formed to be smaller than a depth acquired by summing a depth of an impurity layer (for example, the N+ diffusion layer 153) present in the source/drain formation layer 105 and a width of the depletion layer 161 spreading from the impurity layer.

In a case in which a grinding-side substrate of the logic chip 102 is a P-type substrate, the charging film 130 can be formed to be a film having negative electric charge or a film generating negative electric charge. In other words, the charging film 130 can be configured as a film having negative fixed electric charge. By forming such a charging film 130 in the logic chip 102 after grinding, a Hall accumulation layer can be formed near an interface of the logic chip 102 after grinding. Then, electrons can be re-combined using this hall accumulation layer, and an increase in leakage between wells via the defect 162 formed near the interface can be suppressed.

In a case in which the grinding-side substrate of the logic chip 102 is an N-type substrate, the charging film 130 can be formed to be a film having positive electric charge or a film generating positive electric charge. In other words, the charging film 130 can be configured as a film having positive fixed electric charge. By forming such a charging film 130 in the logic chip 102 after grinding, an electron accumulation layer can be formed near an interface of the logic chip 102 after grinding. Then, protons can be re-combined using this electron accumulation layer, and an increase in leakage between wells via the defect 162 formed near the interface can be suppressed.

For example, as illustrated in FIG. 4, in a case in which the grinding-side substrate of the logic chip 102 is the P well 151, the charging film 130 having negative fixed electric charge is formed. In addition, for example, as illustrated in FIG. 4, in a case in which the grinding-side substrate of the logic chip 102 is the N well 152, the charging film 130 having positive fixed electric charge is formed.

Although described below with reference to FIG. 13, as a charging film formed in the logic chip 102, a film having different characteristics may be formed. For example, as described above, on the grinding-side substrate of the logic chip 102, the charging film 130 having negative fixed electric charge and the charging film 130 having positive fixed electric charge may be formed.

The charging film 130 may be formed of a material that can have fixed electric charge. For example, hafnium oxide, aluminum oxide, zirconium oxide, tantalum oxide, titanium oxide, lanthanum oxide, yttrium oxide, or the like can be used.

A part of the charging film 130 may be nitrided.

In addition, the charging film 130 may be a ferroelectric film formed using a ferroelectric substance that causes electrolysis in the film through spontaneous polarization or piezoelectric polarization. For example, gallium nitride (GaN), barium titanate (BaTi3O), zinc oxide (ZnO), aluminum nitride (ALN), or the like that is polarized to a negative electrode or a positive electrode can be used.

Figure 6:
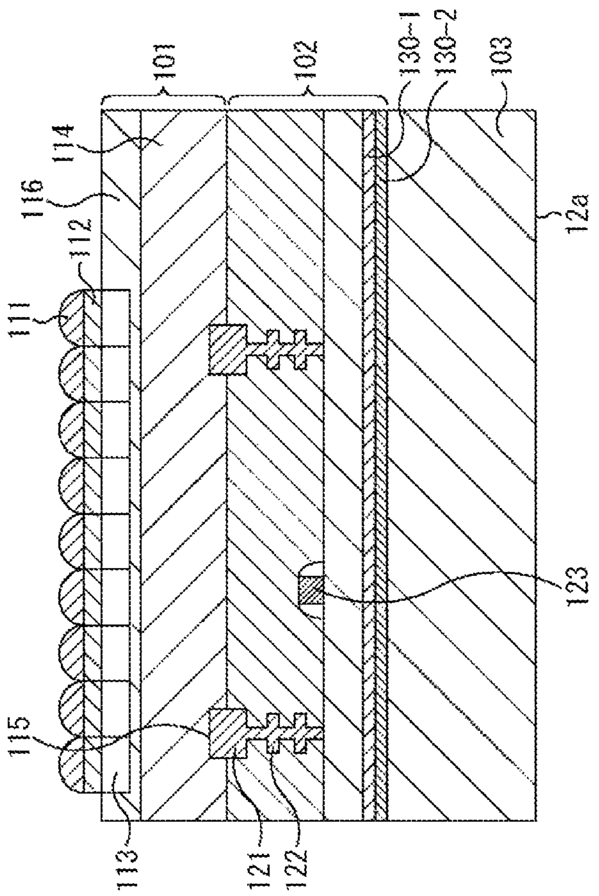
FIG. 6 is a diagram for explaining a case in which charging films are formed in multiple layers.

In addition, the charging film 130 may be composed of a single layer as shown in FIG. 3 or may be composed of multiple layers as shown in FIG. 6. In the logic chip 102 of the imaging element 12*a* shown in FIG. 6, a charging film 130-1 and a charging film 130-2 are stacked. The charging film 130-1 and the charging film 130-2 can be formed using the materials described above.

Although an example in which the charging film 130 is composed of two layers is shown in FIG. 6, the charging film may be composed of multiple layers such as three layers, four layers, or the like. In addition, in a case in which the charging film is composed of multiple layers, the charging film may be composed of layers combining the materials described above. In a case in which the charging film is composed of multiple layers, the charging film can be configured to capture more electrons or protons than in a case in which the charging film is composed of a single layer, and occurrence of leakage can be suppressed more.

Here, materials, the number of layers, and the like forming the charging film 130 can be similarly applied also to the following embodiments.

Second Embodiment

Figure 7:
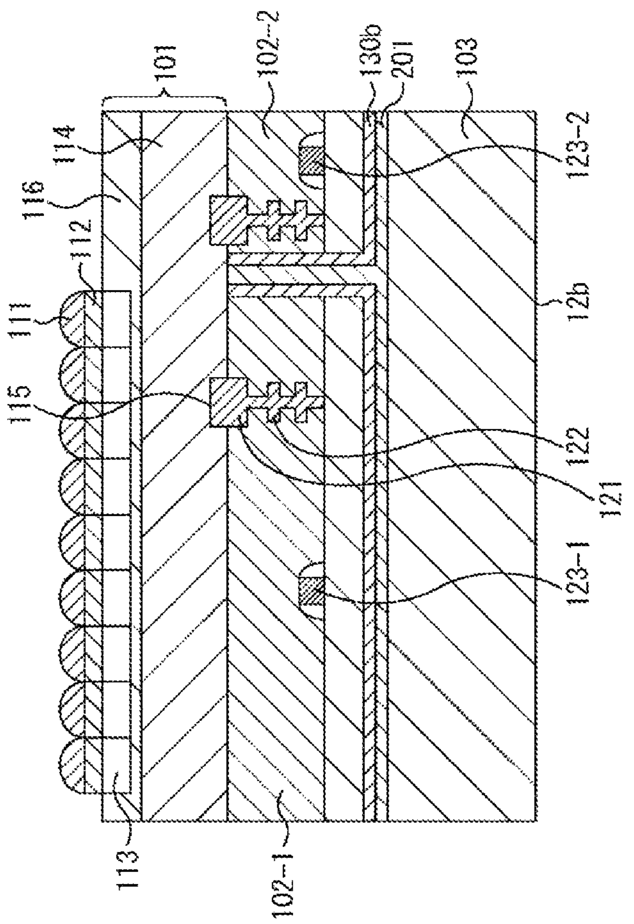
FIG. 7 is a diagram showing a configuration example of a cross-section of an imaging element according to a second embodiment.

FIG. 7 is a diagram showing a configuration example of a cross-section of an imaging element 12 according to a second embodiment (referred to as an imaging element 12*b*).

The imaging element 12*b* according to the second embodiment is different from the imaging element 12*a* according to the first embodiment in that two logic chips 102 are stacked (disposed), and, the other points of the imaging element 12*b* are basically similar to those of the imaging element 12*a*. Hereinafter, description of similar points will be omitted as appropriate.

In the imaging element 12*b* according to the second embodiment, a logic chip 102-1 and a logic chip 102-2 are stacked (disposed) in one CIS chip 101. Here, although the logic chip 102-1 and the logic chip 102-2 are described, any one thereof may be a chip in which a circuit other than a logic circuit such as a memory is formed.

In FIG. 7, although an example in which two chips including the logic chip 102-1 and the logic chip 102-2 are stacked in one CIS chip 101 is illustrated, two or more logic chips 102 may be stacked.

Like the imaging element 12 shown in FIG. 7, in a case in which two logic chips 102-1 and 102-2 are disposed in one CIS chip 101, a gap is generated between the logic chip 102-1 and the logic chip 102-2. In this gap, an oxide film 201 is formed.

In a space of a peripheral portion of the logic chip 102-1 and the logic chip 102-2, a state of being filled with the oxide film 201 is formed. In accordance with this, the logic chip 102-1 and the logic chip 102-2 are in a state of being buried in the oxide film 201.

In addition, charging films 130*b* are also formed (stacked) in the logic chip 102-1 and the logic chip 102-2. The charging films 130*b* are formed also in the gap part between the logic chip 102-1 and the logic chip 102-2. Like the imaging element 12*a* according to the first embodiment, the charging film 130*b* is formed on a face other than a face of each of the logic chip 102-1 and the logic chip 102-2 on which the CIS chip 101 is stacked (hereinafter, referred to as a rear face as appropriately) and is formed on a side face of each of the logic chip 102-1 and the logic chip 102-2.

As illustrated in FIG. 7, on the side face and the rear face of the logic chip 102-1, the charging film 130*b* is formed, and the oxide film 201 is stacked on the charging film 130*b*. In the same manner, on the side face and the rear face of the logic chip 102-2, the charging film 130*b* is formed, and the oxide film 201 is stacked on the charging film 130*b*.

In this way, the charging film 130*b* may be formed also on the side face of the logic chip 102.

Also in the imaging element 12*b* according to the second embodiment, by forming the charging film 130*b*, even when the thickness of the logic chip 102 is formed to be thin, an increase in leakage between wells via a defect formed near an interface can be suppressed.

In addition, in a case in which the logic chip 102 can be formed to be thin, a depth of the gap between the logic chip 102-1 and the logic chip 102-2 can be formed to be shallow as well. Since the gap has the same depth as the thickness of the logic chip 102, in a case in which the logic chip 102 is formed to be thinner, the gap becomes shallower.

In a case in which the gap between the logic chips 102 is large, it becomes difficult to completely fill the oxide film 201, and there is a possibility of being able to form a gap including the air in the oxide film 201. When a gap is present in the oxide film 201, there is a possibility of the stacked support base 103 being bent or being thermally expanded.

However, according to the present technology, by thinning logic chips 102, the gap between the logic chips 102 can be formed to be shallow, and thus the gap can be sufficiently filled with the oxide film 201. Thus, the support base 103 can be prevented from being bent, and formation of a gap including the air between the logic chips 102 can be prevented.

Third Embodiment

Figure 8:
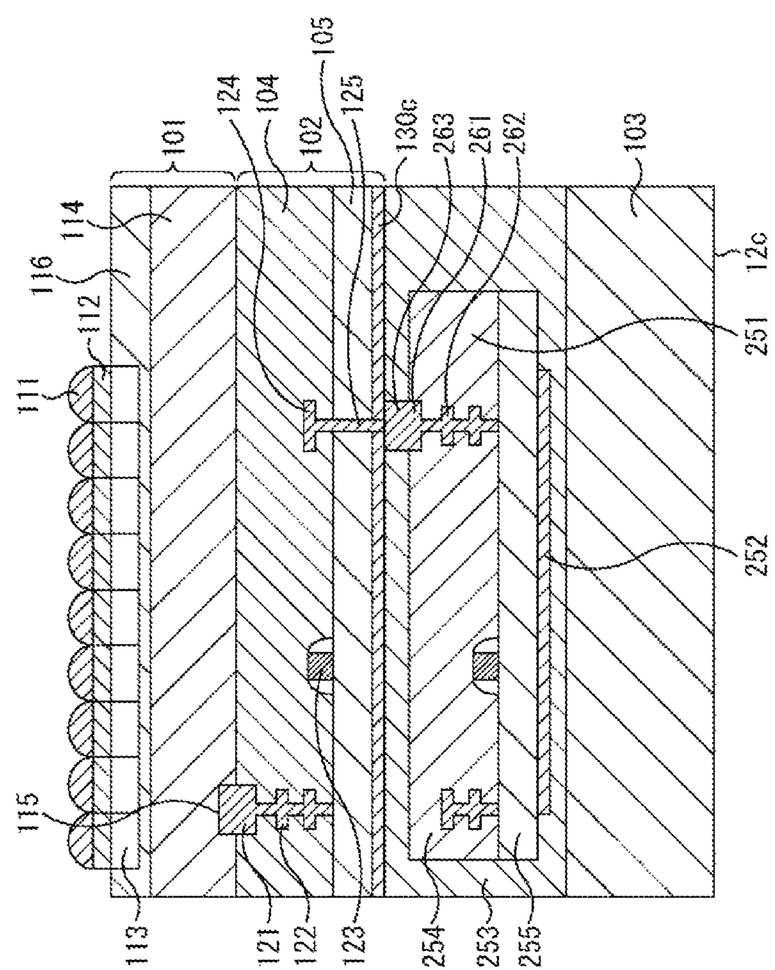
FIG. 8 is a diagram showing a configuration example of a cross-section of an imaging element according to a third embodiment.

FIG. 8 shows a configuration example of a cross-section of an imaging element 12 according to a third embodiment (referred to as an imaging element 12*c*).

The imaging element 12*c* according to the third embodiment is different from the imaging element 12*a* according to the first embodiment in that a chip 251 is additionally stacked, and, the other points of the imaging element 12*c* are basically similar to those of the imaging element 12*a*.

The chip 251 may be a chip in which a logic circuit is formed or a chip in which a memory is formed. In addition, the chip 251 may be a signal processing chip having an artificial intelligence (AI) function.

Here, although a case in which only the chip 251 is stacked in the third layer is illustrated, for example, as in the imaging element 12*b* illustrated in FIG. 7, two or more chips may be stacked (disposed). In addition, when two or more chips are stacked in the third layer, a chip having a memory function and a chip having an AI function may be stacked (disposed).

The chip 251 is stacked on the logic chip 102 via the charging film 130. Similar to the logic chip 102, the chip 251 is composed of a multi-layer wiring layer 254 and a silicon substrate 255. In the multi-layer wiring layer 254, a wiring 262 is formed.

Similar to the CIS chip 101 and the logic chip 102, the logic chip 102 and the chip 251 are connected using pads. A pad 261 is formed on a side on which the logic chip 102 is stacked in the chip 251. A wiring 262 formed in a wiring layer inside the chip 251 is connected to this pad 261.

The pad 261 formed in the chip 251 is connected to a pad 263 formed in an oxide film 253, and this pad 263 is connected to a wiring 124 inside the multi-layer wiring layer 104 of the logic chip 102 via a via 125. Here, in this way, although a case in which the logic chip 102 and the chip 251 are electrically connected to each other using the pad 261 and the pad 263 has been illustrated, they may be connected using another connection method.

On a face (rear face) on a side of the chip 251 opposite to a face on which the logic chip 102 is stacked, that is, on a silicon substrate 255 side, a charging film 252 is formed. This charging film 252 is formed only in a part of the rear face. In the cross-sectional view shown in FIG. 8, the charging film 252 is not formed on an end part side of the chip 251. In addition, the chip 251 including the charging film 252 is in a state of being buried in the oxide film 253.

While the charging film 130*c* is formed to cover the entire rear face of the logic chip 102, the charging film 252 is formed to cover a part of the rear face of the chip 251. The charging film may be formed to cover an entire predetermined face of a chip or may be formed to cover a part of a predetermined face of a chip. In addition, in a case in which the charging film is formed to cover a part of a predetermined face of a chip, for example, the charging film may be formed in a stripe shape. The charging film may be formed in an area in which there is a possibility of leakage due to a defect occurring.

As in the third embodiment, in a case in which a plurality of chips are stacked, a charging film may be formed in each of one or a plurality of chips among them. In addition, as in the logic chip 102 and the chip 251, the present technology can be applied also to a case in which chips of different sizes are stacked.

Also in the imaging element 12*c* according to the third embodiment, by forming the charging film 130*c* and the charging film 252, even when the thicknesses of the logic chip 102 and the chip 251 are formed to be thin, an increase in leakage between wells via a defect formed near an interface can be suppressed.

Fourth Embodiment

A fourth embodiment will be described. In the first to third embodiments, although the imaging element 12 including the charging film has been described as an example, the charging film may be formed in a part other than the chip configuring the imaging element.

Figure 9:
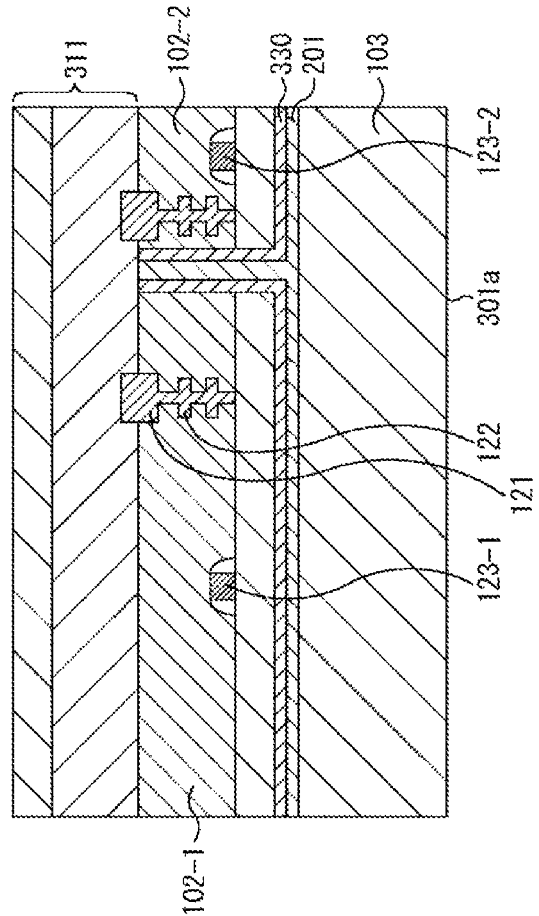
FIG. 9 is a diagram showing a configuration example of a cross-section of a stacked chip according to a fourth embodiment.

FIG. 9 is a diagram showing a configuration example of a stacked chip according to a fourth embodiment. In a stacked chip 301*a* shown in FIG. 9, a memory chip 311, a logic chip 102, and a support base 103 are sequentially stacked from the upper side in the drawing. The stacked chip 301*a* shown in FIG. 9 has a difference of the memory chip 311 being configured instead of the CIS chip 101 of the imaging element 12*b* shown in FIG. 7, and the other points are similar thereto.

In the stacked chip 301*a* shown in FIG. 9, a logic chip 102-1 and a logic chip 102-2 are stacked (disposed) in one memory chip 311. According to the stacked chip 301*a*, for example, data processed by the logic chip 102-1 is stored in the memory chip 311, and the logic chip 102-2 can perform a predetermined process using the stored data.

A charging film 330 is formed on a rear face of each of the logic chip 102-1 and the logic chip 102-2 of the stacked chip 301*a*. This charging film 330, for example, is a film corresponding to the charging film 130*b* of the imaging element 12*b* according to the second embodiment and can be configured to have the same configuration (a material and the like) as the charging film 130*a* according to the first embodiment. Thus, even when the logic chip 102-1 and the logic chip 102-2 are formed to be thin, occurrence (an increase) of leakage due to a defect present on the rear face side can be prevented.

By thinning the thicknesses of the logic chip 102-1 and the logic chip 102-2, the thickness of the stacked chip 301*a* in which the logic chip 102-1 and the logic chip 102-2 are stacked can be thinned. Thus, it is possible to implement a low height and a small size of the stacked chip 301*a*.

Fifth Embodiment

Figure 10:
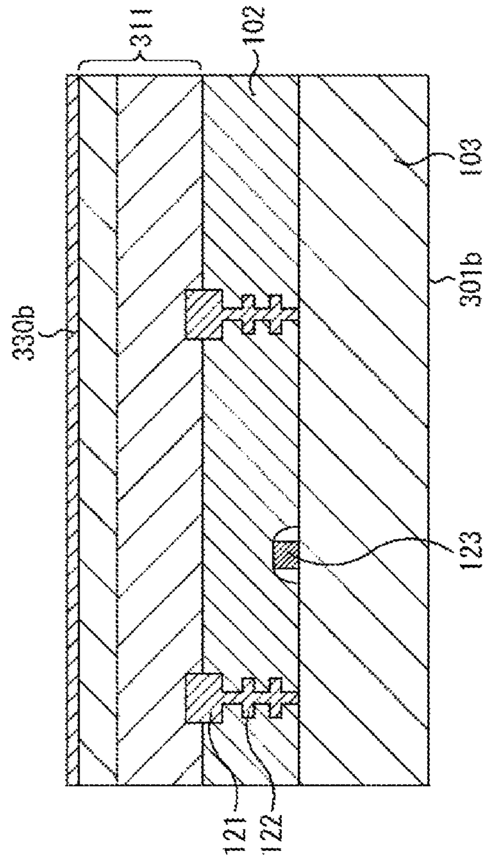
FIG. 10 is a diagram showing a configuration example of a cross-section of a stacked chip according to a fifth embodiment.

FIG. 10 is a diagram showing a configuration example of a stacked chip 301*b* according to a fifth embodiment.

In the stacked chip 301*b* according to the fifth embodiment, similar to the stacked chip 301*a* according to the fourth embodiment (FIG. 9), a memory chip 311, a logic chip 102, and a support base 103 are stacked. In the stacked chip 301*b* according to the fifth embodiment, a charging film 330*b* is formed in the memory chip 311.

The charging film 330 may be formed in the logic chip 102 as in the stacked chip 301*a* illustrated in FIG. 9 or may be formed in the memory chip 311 as in the stacked chip 301*b* illustrated in FIG. 10.

In addition, the charging film 330 may be formed on a face of a side on which the support base 103 is stacked or may be formed on a face of a side on which the support base 103 is not stacked. Furthermore, similar to the example shown in FIG. 10, the charging film 330 may be formed on a side not being stacked with other chips, in other words, in an exposed state.

In addition, the logic chip 102 stacked (disposed) on the memory chip 311 may be a plurality of logic chips 102 as in the stacked chip 301*a* according to the fourth embodiment or may be one logic chip 102 as in the stacked chip 301*b* according to the fifth embodiment.

By combining the fourth embodiment and the fifth embodiment, a configuration in which charging films are formed on both the memory chip 311 and the logic chip 102 may be employed.

The charging film is formed on a predetermined face of one or a plurality of chips among a plurality of chips configuring the stacked chip 301. The chips that are stacked (disposed) may have a one-to-one relation or a one-to-multiple relation.

By thinly forming a chip desired to be formed to be thin and forming a charging film in the thinly-formed chip, even when there is a defect formed at the time of the thinning process, occurrence of leakage via the defect can be prevented. Thus, a thinly-formed chip capable of suppressing leakage can be stacked, and a low height and a small size of the stacked chip 301 can be implemented.

Sixth Embodiment

Figure 11:
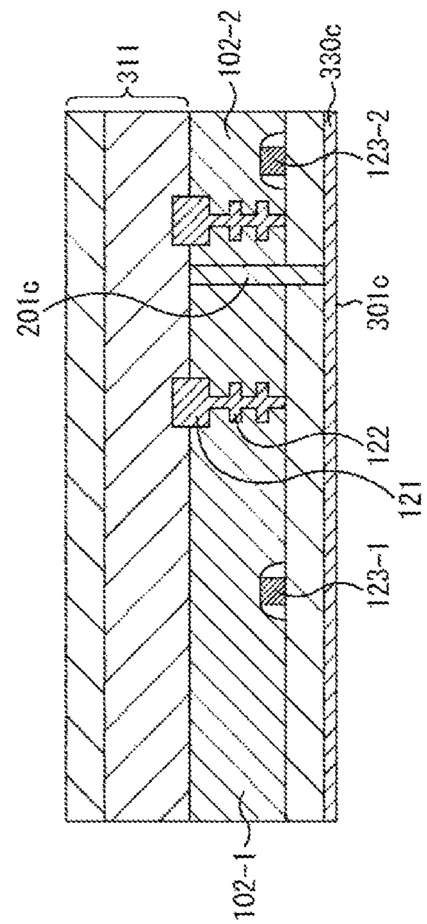
FIG. 11 is a diagram showing a configuration example of a cross-section of a stacked chip according to a sixth embodiment.

FIG. 11 is a diagram showing a configuration example of a stacked chip 301*c* according to a sixth embodiment.

The stacked chip 301*c* according to the sixth embodiment has a different configuration that is acquired by eliminating the support base 103 from the stacked chip 301*a* according to the fourth embodiment. A configuration in which no support base 103 is disposed in the stacked chip 301 may be employed.

In addition, the stacked chip 301*c* according to the sixth embodiment is different from the stacked chip 301*a* according to the fourth embodiment in that a gap part between a logic chip 102-1 and a logic chip 102-2 is filled with only an oxide film 201*c*. In other words, the charging film 330*c* is not formed on a side face of each of the logic chip 102-1 and the logic chip 102-2.

The charging film may be configured to be formed on the side face of the chip or configured not to be formed thereon.

Whether or not the charging film is formed on the side face of the chip depends on a difference in the process performed at the time of manufacturing. As illustrated in FIG. 11, in a case in which the charging film 330*c* is not formed on the side faces of the logic chip 102-1 and the logic chip 102-2, after the logic chip 102-1 and the logic chip 102-1 are disposed in the memory chip 311, the oxide film 201*c* is filled (in a gap) between the logic chip 102-1 and the logic chip 102-2 is filled with.

When the oxide film 201*c* is filled in the gap, it is formed also on the rear face of the logic chip 102-1 and the logic chip 102-2, and the oxide film 201*c* formed on the rear face sides is eliminated, for example, using chemical mechanical polish (CMP). Thereafter, when the charging film 330*c* is formed, a stacked chip 301*c* as shown in FIG. 11 is manufactured.

FIG. 9 will be referred to again. As in the stacked chip 301*a* shown in FIG. 9, in a case in which the charging film 330 is formed on the side faces of the logic chip 102-1 and the logic chip 102-2, after the logic chip 102-1 and the logic chip 102-1 are disposed in the memory chip 311, the charging film 330 is formed on the side face and the rear face of each of the logic chip 102-1 and the logic chip 102-2.

Thereafter, the oxide film 201 is filled in a gap between the logic chip 102-1 and the logic chip 102-2 and is formed on the rear face of each of the logic chips. In this way, after the charging film 330 is formed, when the oxide film 201 is formed, the stacked chip 301*a* as shown in FIG. 9 is manufactured.

Also in the stacked chip 301*c* according to the sixth embodiment shown in FIG. 11, as in the embodiment described above, by forming the charging film 330*c*, occurrence (an increase) of leakage via a defect can be suppressed. Thus, the stacked chip 301*c* can be formed to be thin. In addition, by employing a configuration having no support base 103, the stacked chip 301*c* can be formed on a thinner side.

Such a stacked chip 301*c* having no support base 103 can be mounted with a small gap.

Seventh Embodiment

Figure 12:
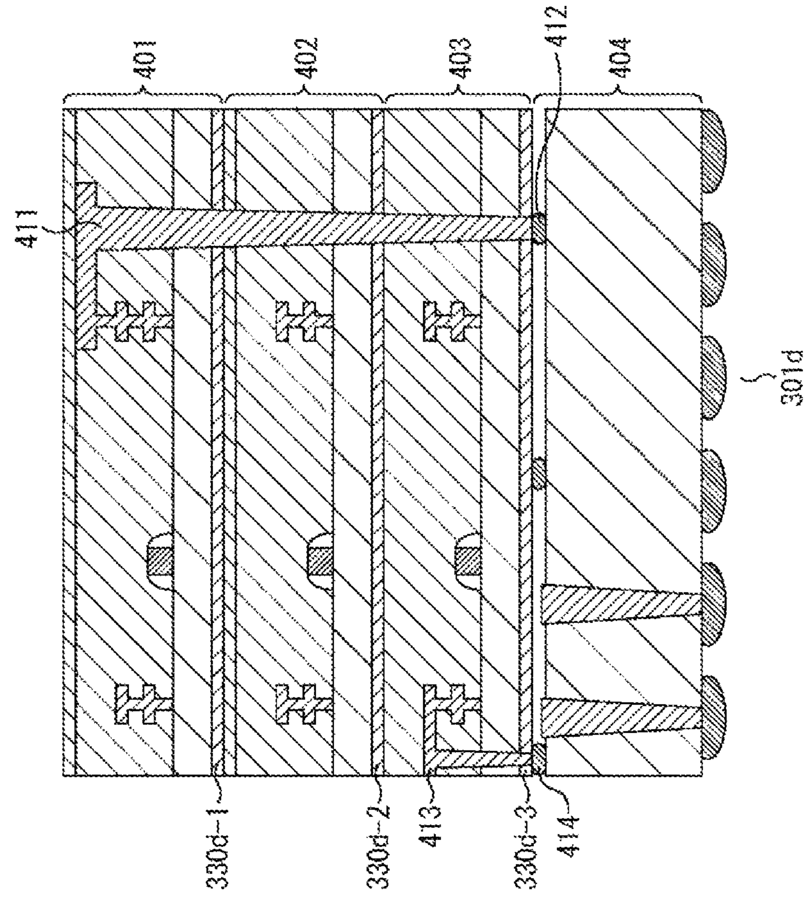
FIG. 12 is a diagram showing a configuration example of a cross-section of a stacked chip according to a seventh embodiment.

FIG. 12 is a diagram showing a configuration example of a stacked chip 301*d* according to a seventh embodiment.

The stacked chip 301*d* according to the seventh embodiment is configured such that a plurality of chips are stacked. In the embodiments described above, although a case in which the chips are a CIS chip, a memory chip, a logic chip, and the like has been described as an example, the stacked chips may be such chips or may be other chips not illustrated therein.

The stacked chip 301*d* shown in FIG. 12 illustrates an example in which a chip 401, a chip 402, and a chip 403 are stacked from the top in the drawing, and a support base 404 is further stacked. The chip 401, the chip 402, and the chip 403 may be chips such as a CIS chip, a memory chip, and a logic chip.

A charging film 330*d*-1 is formed on a rear face of the chip 401, a charging film 330*d*-2 is formed on a rear face of the chip 402, and a charging film 330*d*-3 is formed on a rear face of the chip 403. The chips 401 to 403 respectively include the charging films 330*d*-1 to 330*d*-3 and thus have configurations capable of suppressing occurrence of leakage.

The chips 401 to 403 can be formed on a thin side. By forming the chips 401 to 403 to be thin, the stacked chip 301*d* can be implemented to have a low height and a small size.

Although the stacked chip 301*d* shown in FIG. 12 is configured such that three chips 401 to 403 are stacked, the present technology can be applied also to a case in which four or more chips are stacked. In addition, according to the present technology, each chip can be reduced in height, and thus, in a case in which a plurality of chips are stacked, the height can be reduced more than in a conventional case.

For connection of the chips 401 to 403, a through-silicon via (TSV), a bump, a CuCu connection, or the like can be applied. For example, the chip 401 and the support base 404 are connected using a TSV 411. In addition, the TSV 411 and the support base 404 are connected using the bump 412.

Similarly, the chip 403 and the support base 404 are connected using a TSV 413, and the TSV 413 and the support base 404 are connected using a bump 414.

By applying the present technology, the TSV 411 and the TSV 413 can be formed to be thin. For example, the TSV 411 is formed from the chip 401 to the bump 412 by passing through the chip 402 and the chip 403. Generally, a TSV is formed in a so-called tapered shape in which an opening part is widened and is gradually narrowed from the opening part.

Generally, when a depth in which the TSV 411 is formed becomes larger, the opening part of the tapered shape becomes larger and needs to be formed to be thick. According to the present technology, each of the chips 401 to 403 can be formed to be thin.

Thus, the depth in which the TSV 411 is formed can be shortened, and the TSV 411 can be formed to be thin. By forming the TSV 411 to be thin, an area in which the TSV 411 is formed on the plane can be decreased, and the size of the stacked chip 301*d* can be decreased.

Also in the stacked chip 301*d* according to the seventh embodiment shown in FIG. 12, by forming the charging film 330*d* as in the embodiments described above, occurrence (an increase) of leakage via a defect can be suppressed. Thus, the stacked chip 301*d* can be formed to be thin, and a low height and a small size can be implemented.

Eighth Embodiment

Figure 13:
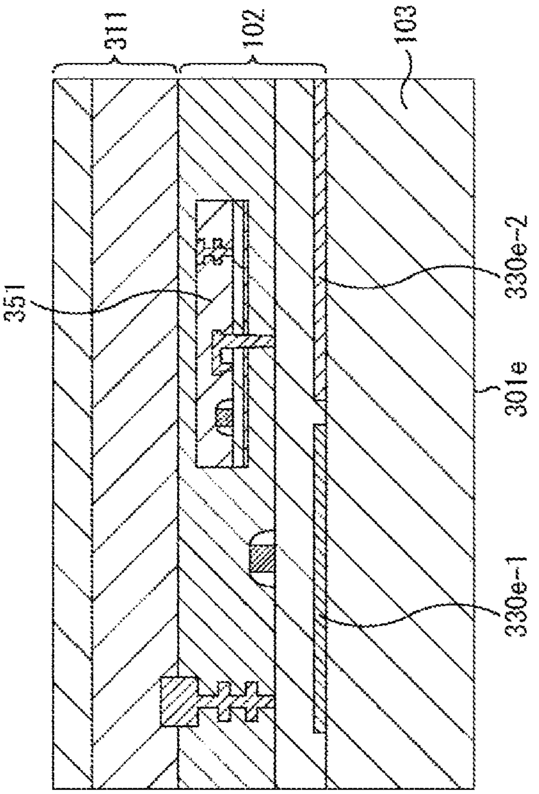
FIG. 13 is a diagram showing a configuration example of a cross-section of a stacked chip according to an eighth embodiment.

FIG. 13 is a diagram showing a configuration example of a stacked chip 301*e* according to an eighth embodiment.

The stacked chip 301*e* according to the eighth embodiment is configured such that a logic chip 102 includes a monolithic device, which is different from the stacked chip 301*b* according to the fifth embodiment (FIG. 10). The monolithic device is an integrated circuit in which a transistor, a diode, a resistor, a capacitor, and the like are formed and wired on one substrate or inside a substrate.

In the example shown in FIG. 13, a monolithic device 351 is present inside the logic chip 102. By employing a configuration in which the logic chip 102 includes the monolithic device 351, a mounting area can be increased.

In the example shown in FIG. 13, a charging film 330*e*-1 and a charging film 330*e*-2 are formed on a rear face of the logic chip 102. For example, as a negative fixed electric charge film and a positive fixed electric charge film, the charging film 330*e*-1 and the charging film 330*e*-2 may be films having different features. In addition, the charging film 330*e*-1 and the charging film 330*e*-2 may be configured as films having features appropriate for a chip in accordance with features of the chip of a formed area, for example, whether the chip is a P-type chip or an N-type chip.

In this way, the charging films can be formed regardless of a type of chip. Also in the stacked chip 301*e* according to the eighth embodiment shown in FIG. 13, as the embodiment described above, by forming the charging film 330*e*, occurrence (an increase) of leakage via a defect can be suppressed. Thus, the stacked chip 301*e* can be formed to be thin, and a low height and a small size of the stacked chip 301*e* can be implemented.

Ninth Embodiment

Figure 14:
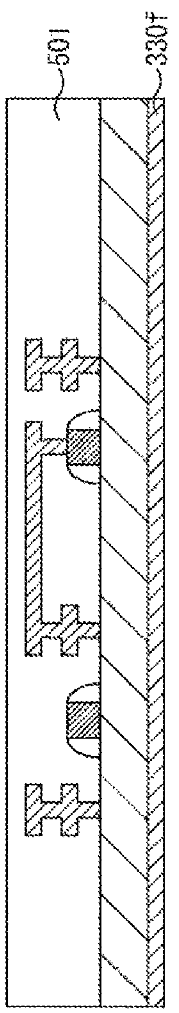
FIG. 14 is a diagram showing a configuration example of a cross-section of a single-layer chip according to a ninth embodiment.

FIG. 14 is a diagram showing a configuration example of a single-layer chip 501 according to a ninth embodiment.

In the first to eighth embodiments, although a case in which a plurality of chips are stacked has been described as an example, as shown in FIG. 14, one chip (a single layer) may be configured. A single-layer chip 501 shown in FIG. 14 is configured as a single layer, and a charging film 330*f* is formed on a rear face thereof.

Also in the single-layer chip 501 according to the ninth embodiment shown in FIG. 14, as in the embodiment described above, by forming the charging film 330*f*, occurrence (an increase) of leakage via a defect can be suppressed. Thus, the single-layer chip 501 can be formed to be thin, and a low height and a small size of the single-layer chip 501 can be implemented.

The single-layer chip 501 is formed to be a single layer and thin, for example, 20 um or less and thus, for example, can be used as a bendable device such as a wearable device or the like.

According to the present technology, even in a case in which a defect occurs in a chip (device), occurrence (an increase) of leakage due to the defect can be prevented. Thus, a chip (device) is formed to be thin, and a low height and a small size of the chip can be implemented. In addition, even when a charging film is formed in a chip (device), there is no change in features of the chip (device), and thus the effects described above can be acquired with the features of the chip (device) maintained.

Furthermore, by forming the charging film on the rear face of the chip (device), the charging film can be formed such that there is no influence on a deep position of the chip (device). Although, at deep positions of the chip (device), for example, areas corresponding to a source and a drain of a transistor are formed, the charging film is not formed at positions having influence on such areas, and thus there is no deterioration of the reliability of the chip (device).

Tenth Embodiment

In the first to ninth embodiments described above, wirings disposed in a wiring layer are formed using metal. In order to prevent diffusion of the wirings (metal) disposed in this wiring layer, a metal diffusion prevention film may be configured to be included.

A 10th embodiment and an 11th embodiment to be described below may be combined with any one of the first to ninth embodiments described above.

Figure 15:
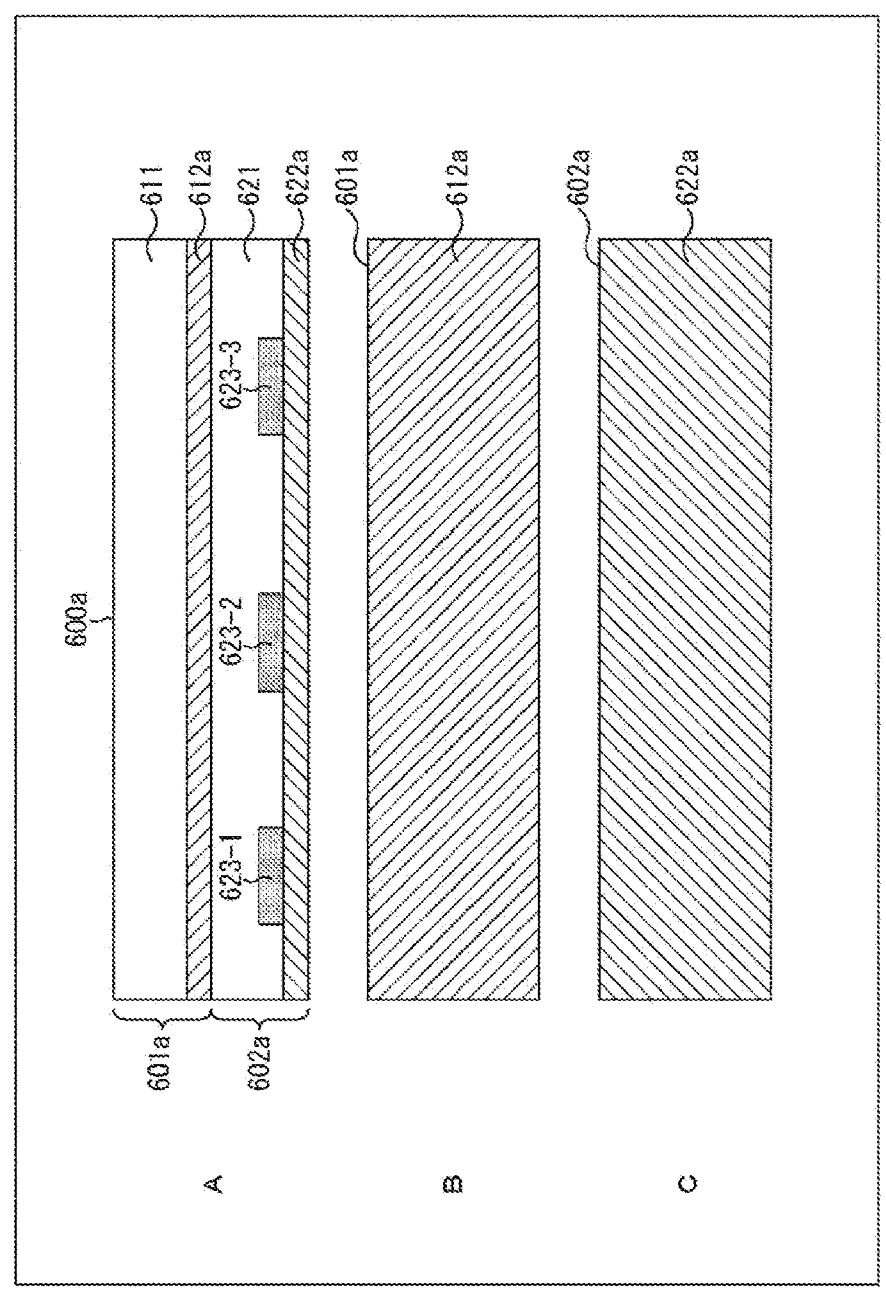
FIG. 15 is a diagram showing a configuration example of a chip according to a (10-1)-st embodiment.

A to C of FIG. 15 are diagrams showing a configuration example of a stacked chip 600*a* acquired in a case in which a metal diffusion prevention film is disposed. Description of the stacked chip 600*a* shown in FIG. 15 will be appropriately continued as a stacked chip 600 according to a (10-1)-st embodiment. A of FIG. 15 shows a configuration example of a cross-section of the stacked chip 600*a*, B of FIG. 15 shows a configuration example of a charging film 612*a* in the plan view of the stacked chip 600*a*, and C of FIG. 15 shows a configuration example of a metal diffusion prevention film 622*a* in the plan view of the stacked chip 600*a*.

As shown in A of FIG. 15, the stacked chip 600*a* is formed to have a configuration in which a chip 601*a* and a chip 602*a* are stacked. In the following description, although a case in which a bottom face of the chip 601*a* and a bottom face of the chip 602*a* are formed in sizes of a same degree as an example will be continued to be described, the present technology can be applied also to a case in which the bottom faces are formed in different sizes.

The chip 601*a* has a configuration in which a silicon substrate 611 and the charging film 612*a* are stacked. FIG. 15 shows a part of the configuration of the chip 601*a* that is necessary for description, and the description will be continued. The description will be presented with other parts necessary for the description shown together.

The chip 602*b* has a configuration in which a wiring layer 621 and a metal diffusion prevention film 622*a* are stacked. A wiring layer 621 includes wirings 623-1 to 623-3. For example, the metal diffusion prevention film 622*a* is configured using SiN, SiC, SiN, or the like.

As in the embodiments described above, the charging film 612*a* is formed on the bottom face of the chip 601*a*, and thus a configuration in which a flow of a leakage current via a defect is suppressed is formed. As shown in B of FIG. 15, the charging film 612*a* is formed in the entirely of the bottom face of the chip 601*a*.

Similarly, as shown in C of FIG. 15, the metal diffusion prevention film 622*a* is formed on the entire bottom face of the chip 601*a* as well. In the example illustrated in FIG. 15, the charging film 612*a* and the metal diffusion prevention film 622*a* are formed in sizes of the same degree as the bottom face of the chip 601*a*. In this way, the charging film 612*a* and the metal diffusion prevention film 622*a* can be formed in areas of the same degree.

Figure 16:
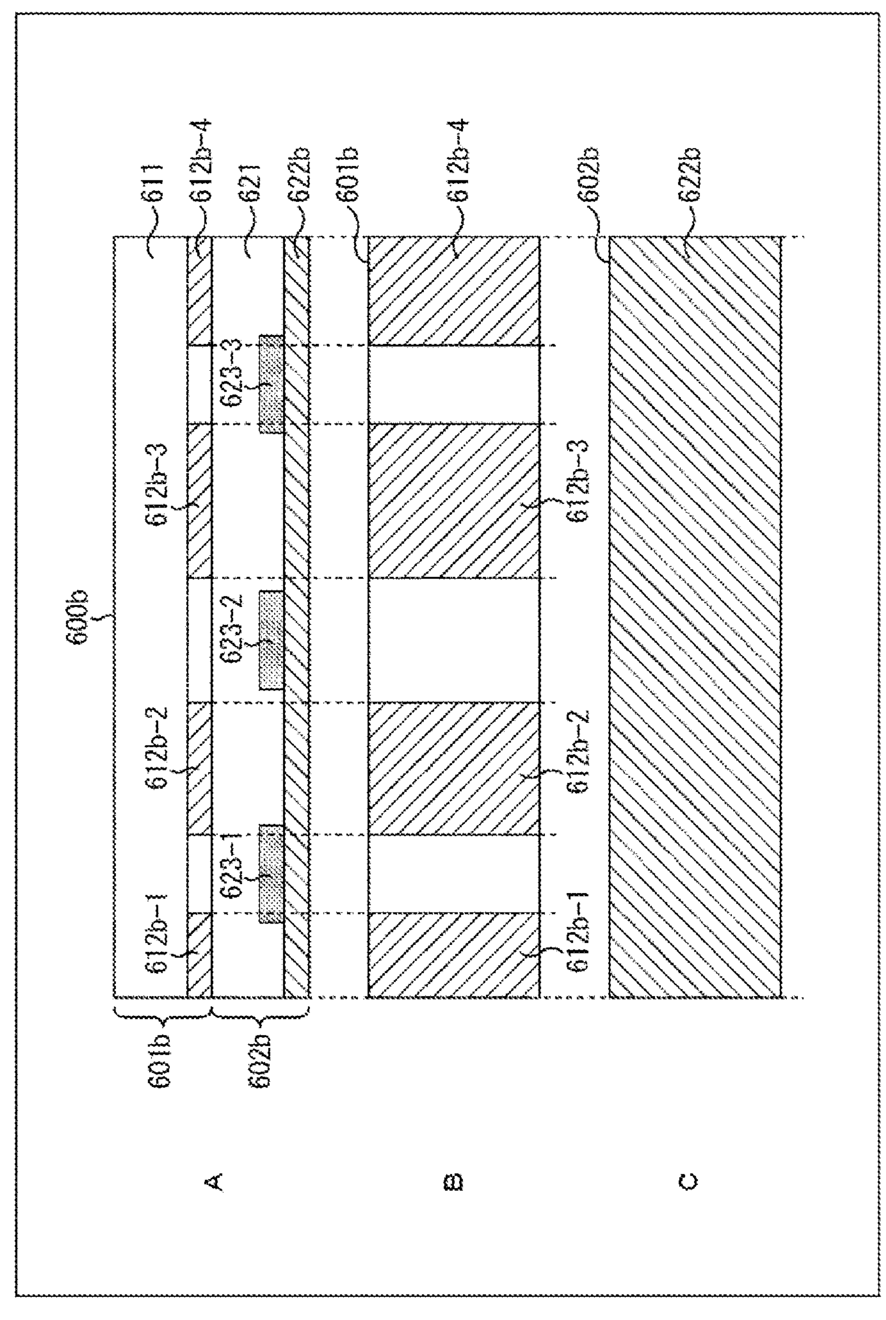
FIG. 16 is a diagram showing a configuration example of a chip according to a (10-2)-nd embodiment.

In a case in which the charging film 612*a* and the metal diffusion prevention film 622*a* are formed with areas of the same degree, and, for example, the influences of stress, heat, hydrogen, and the like on the charging film 612*a* according to the metal diffusion prevention film 622*a* are concerned, a configuration as shown in FIG. 16 may be employed.

(10-2)-nd Embodiment

FIG. 16 shows a configuration of a stacked chip 600*b* according to a (10-2)-nd embodiment. A of FIG. 16 shows a configuration example of a cross-section of the stacked chip 600*b*, B of FIG. 16 shows a configuration example of a charging film 612*b* in the plan view of the stacked chip 600*b*, and C of FIG. 16 shows a configuration example of a metal diffusion prevention film 622*b* in the plan view of the stacked chip 600*a*.

The charging film 612*b* of the stacked chip 600*b* according to the (10-2)-nd embodiment is formed with an area different from that of the metal diffusion prevention film 622*b*, which is different from the charging film 612*a* of the stacked chip 600*a* (FIG. 15) according to the (10-1)-st embodiment, and the other points are similar to the charging film 612*a*.

The charging film 612*b* of the stacked chip 600*b* shown in FIG. 16 is formed in a part of a bottom face of the chip 601*b*. In the example shown in FIG. 16, a charging film 612*b*-1, a charging film 612*b*-2, a charging film 612*b*-3, and a charging film 612*b*-4 are formed on the bottom face of the chip 601*b*. A total area acquired by adding areas of the charging film 612-1, the charging film 612*b*-2, the charging film 612*b*-3, and the charging film 612*b*-4 is smaller than the area of the bottom face of the chip 601*b* and is smaller than the area of the metal diffusion prevention film 622*b*.

A wiring 623-1 is positioned between the charging film 612*b*-1 and the charging film 612*b*-2, a wiring 623-2 is positioned between the charging film 612*b*-2 and the charging film 612*b*-3, and a wiring 623-3 is positioned between the charging film 612*b*-3 and the charging film 612*b*-4. The charging film 612*b* shown in FIG. 16 is formed in a state in which there is an area in which a part of the charging film 612*b* overlaps the wiring 623 in the plan view or a state in which there is no area in which the charging film 612*b* and the wiring 623 overlap each other.

In the example shown in FIG. 16, an example in which, by adjusting a width of the charging film 612*b* in a horizontal direction in the drawing, the area of the charging film 612*b* is configured to be smaller than the area of the metal diffusion prevention film 622*b* is illustrated. By adjusting a width in a vertical direction in the drawing, the area of the charging film 612*b* may be configured to be smaller than the area of the metal diffusion prevention film 622*b*.

In addition, also in the following embodiments, although a case in which the area is adjusted by adjusting the width in the horizontal direction in the drawing will be described as an example, the area may be adjusted by adjusting a width in the vertical direction in the drawing. Furthermore, the area may be adjusted by adjusting the widths in both the horizontal direction and the vertical direction.

In this way, by configuring the area of the charging film 612*b* and the area of the metal diffusion prevention film 622 with different sizes, influences of stress and the like on the charging film 612*b* according to the metal diffusion prevention film 622*b* can be reduced.

(10-3)-rd Embodiment

Figure 17:
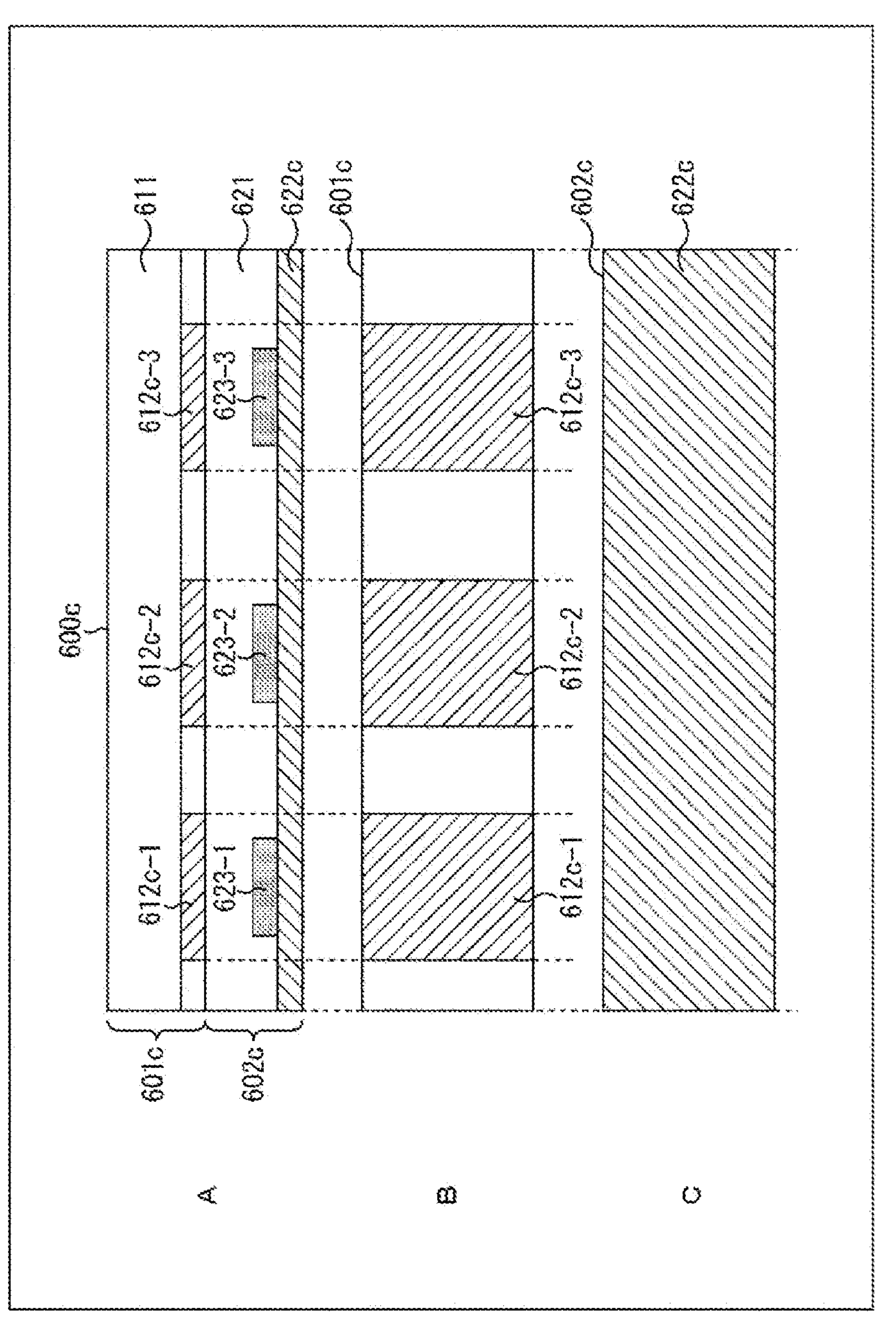
FIG. 17 is a diagram showing a configuration example of a chip according to a (10-3)-rd embodiment.

FIG. 17 is a diagram showing a configuration example of a stacked chip 600*c* according to a (10-3)-rd embodiment. A of FIG. 17 shows a configuration example of a cross-section of the stacked chip 600*c*, B of FIG. 17 shows a configuration example of a charging film 612*c* in the plan view of the stacked chip 600*c*, and C of FIG. 17 shows a configuration example of a metal diffusion prevention film 622*c* in the plan view of the stacked chip 600*c*.

Although an example in which the charging film 612*b* shown in FIG. 16 described above is basically formed in an area not overlapping an area in which a wiring 623 is formed has been illustrated, as shown in FIG. 17, the charging film 612*c* may be formed in an area overlapping the wiring 623.

The charging film 612*c* of the stacked chip 600*c* shown in FIG. 17 is formed in a part of a bottom face of the chip 601*c*. In the example shown in FIG. 17, a charging film 612*c*-1, a charging film 612*c*-2, and a charging film 612*c*-3 are formed on the bottom face of the chip 601*c*. A total area acquired by adding areas of the charging film 612-1, the charging film 612*c*-2, and the charging film 612*c*-3 is smaller than the area of the bottom face of the chip 601*c* and is smaller than the area of the metal diffusion prevention film 622*c*.

The charging film 612*c* shown in FIG. 17 is formed in a state in which there is an overlapping area between the charging film 612*c* and a wiring 623 in the plan view. In the cross-section, the charging film 612*c*-1 is positioned on a wiring 623-1, the charging film 612*c*-2 is positioned on a wiring 623-2, and the charging film 612*c*-3 is positioned on a wiring 623-3.

In this way, by configuring the area of the charging film 612*c* and the area of the metal diffusion prevention film 622*c* with different sizes, influences of stress and the like on the charging film 612*c* according to the metal diffusion prevention film 622*c* can be reduced.

Like the charging film 612*b* according to the (10-2)-nd embodiment and the charging film 612*c* according to the (10-3)-rd embodiment, in a case in which the charging film 612 is disposed in a part of the bottom face of the chip 601, as an area in which the charging film 612 is disposed, an area in which leakage can easily occur may be formed.

As described with reference to FIG. 5, there is a possibility of leakage occurring between the N+ diffusion layer 153 and the depletion layer 161 via the defect 162, and the charging film 612 is disposed for suppressing such leakage. For example, by forming the charging film 612 in an area in which the defect 162 may easily occur, the depletion layer 161, or the like, even when the charging film 612 is configured to be disposed only in a part of the bottom face of the chip 601, the capability of suppressing leakage can be configured not to be reduced.

(10-4)-th Embodiment

Figure 18:
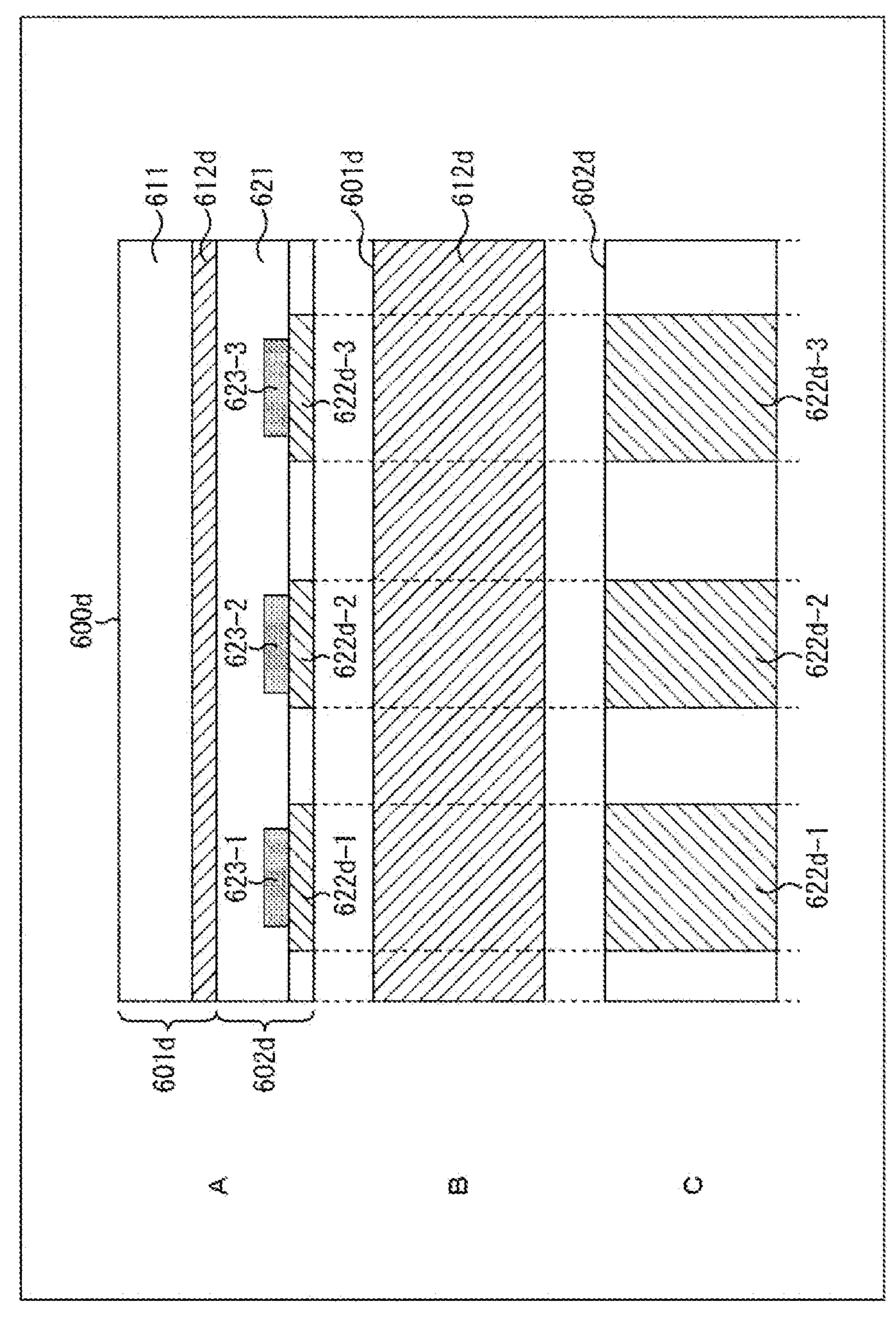
FIG. 18 is a diagram showing a configuration example of a chip according to a (10-4)-th embodiment.

FIG. 18 is a diagram showing a configuration of a stacked chip 600*d* according to a (10-4)-th embodiment. A of FIG. 18 shows a configuration example of a cross-section of the stacked chip 600*d*, B of FIG. 18 shows a configuration example of a charging film 612*d* in the plan view of the stacked chip 600*d*, and C of FIG. 18 shows a configuration example of a metal diffusion prevention film 622*d* in the plan view of the stacked chip 600*d*.

In the (10-1)-st to the (10-3)-rd embodiments, a case in which the charging film 612 and the metal diffusion prevention film 622 are formed with different areas by forming the area of the charging film 612 to be smaller than the area of the metal diffusion prevention film 622 has been described as an example. In the (10-4)-th embodiment, a case in which a charging film 612 and a metal diffusion prevention film 622 are formed with different areas by forming the area of the metal diffusion prevention film 622 to be smaller than the area of the charging film 612 will be described as an example.

The metal diffusion prevention film 622*d* of the stacked chip 600*d* shown in FIG. 18 is formed in a part of a bottom face of the chip 602*d*. In the example shown in FIG. 18, a metal diffusion prevention film 622*d*-1, a metal diffusion prevention film 622*d*-2, and a metal diffusion prevention film 622*d*-3 are formed on the bottom face of the chip 602*d*. A total area acquired by adding areas of the metal diffusion prevention film 622*d*-1, the metal diffusion prevention film 622*d*-2, and the metal diffusion prevention film 622*d*-3 is smaller than the area of the bottom face of the chip 602*d* and is smaller than the area of the charging film 612*d*.

The metal diffusion prevention film 622*d* shown in FIG. 18 is formed in a state in which there is an overlapping area between the metal diffusion prevention film 622*d* and a wiring 623 in the plan view. The metal diffusion prevention film 622*d* is a film disposed such that metal configuring the wiring 623 is not diffused and thus is formed at a position overlapping the wiring 623. In a cross-section, the metal diffusion prevention film 622*d*-1 is positioned under a wiring 623-1, the metal diffusion prevention film 622*d*-2 is positioned under a wiring 623-2, and the metal diffusion prevention film 622*d*-3 is positioned under a wiring 623-3.

In this way, by configuring the area of the metal diffusion prevention film 622*d* and the area of the charging film 612*d* with different sizes, influences of stress and the like on the charging film 612*d* according to the metal diffusion prevention film 622*d* can be reduced.

(10-5)-th Embodiment

Figure 19:
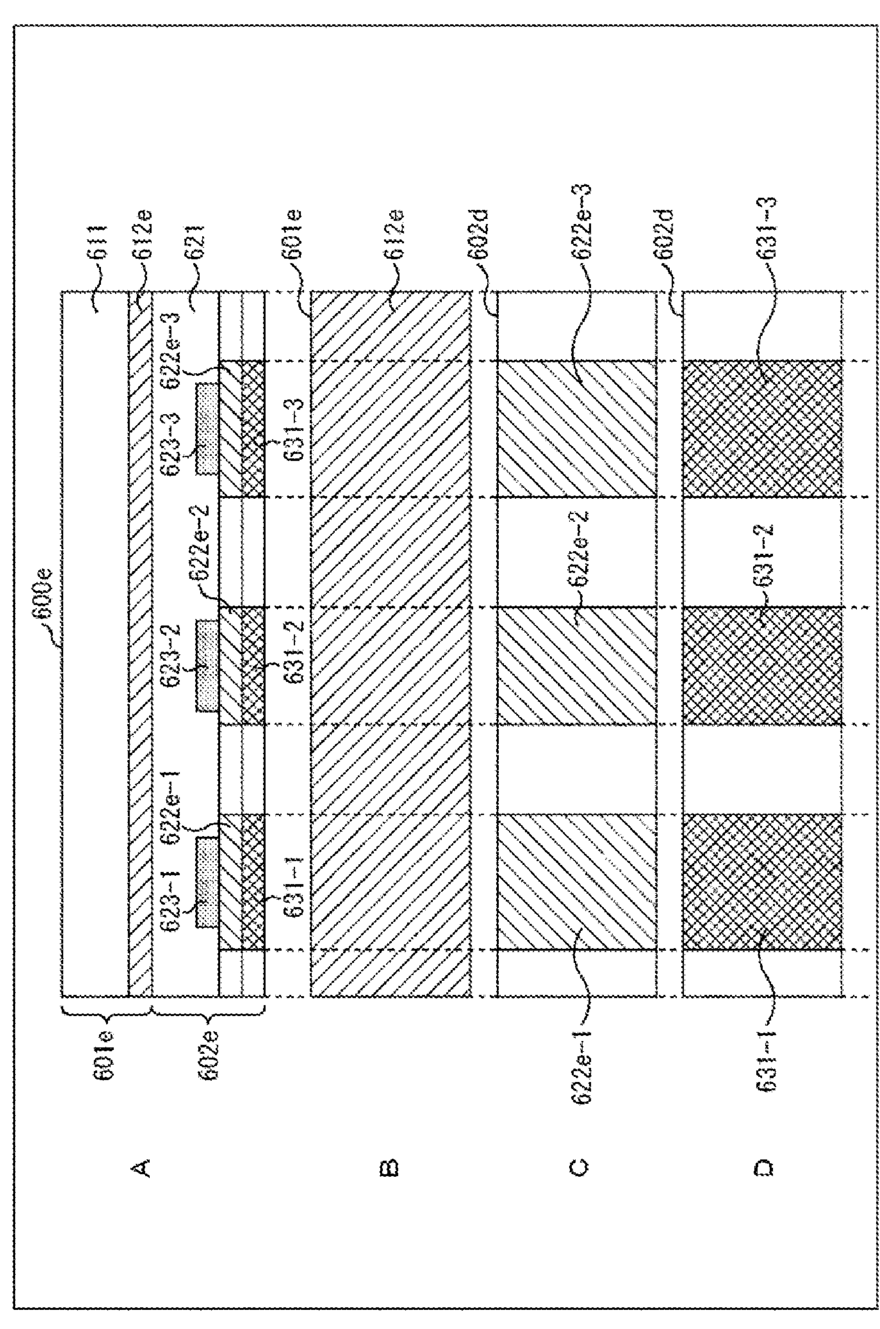
FIG. 19 is a diagram showing a configuration example of a chip according to a (10-5)-th embodiment.

FIG. 19 is a diagram showing a configuration of a stacked chip 600*e* according to a (10-5)-th embodiment. A of FIG. 19 shows a configuration example of a cross-section of the stacked chip 600*e*, B of FIG. 19 shows a configuration example of a charging film 612*e* in the plan view of the stacked chip 600*e*, C of FIG. 19 shows a configuration example of a metal diffusion prevention film 622*e* in the plan view of the stacked chip 600*e*, and D of FIG. 19 shows a configuration example of a passivation film 631 in the plan view of the stacked chip 600*e*.

The stacked chip 600*e* includes the passivation film 631, which is different from the stacked chips 600*a* to 600*d* according to the (10-1)-st to (10-4)-th embodiments. Although FIG. 19 shows an example in which the passivation film 631 is disposed in the stacked chip 600*d* according to the (10-4)-th embodiment, a configuration in which the passivation film 631 is disposed in the stacked chips 600*a* to 600*c* according to the (10-1)-st to (10-3)-rd embodiments may be employed.

The passivation film 631 is stacked on the metal diffusion prevention film 622*e*. The passivation film 631 is a film that is disposed for preventing an influence of outer air, attachment of contaminants, and the like and, for example, can be configured using a single-layer film of silicon nitride (SiN), silicon oxide (SiO2), silicon oxynitride (SiON), or the like or a stacked film thereof.

The passivation film 631 is formed at the same position as that of the metal diffusion prevention film 622*e* with an equal size. In the example illustrated in FIG. 19, a passivation film 631-1 is stacked on a metal diffusion prevention film 622*e*-1, a passivation film 631-2 is stacked on a metal diffusion prevention film 622*e*-2, and a passivation film 631-3 is stacked on a metal diffusion prevention film 622*e*-3.

Although not illustrated, for example, as in the case of the metal diffusion prevention film 622*c* of the stacked chip 600*c* shown in FIG. 17, in a case in which the passivation film 631 is disposed in the configuration in which the metal diffusion prevention film 622*c* is formed on the entire bottom face of the chip 602*c*, the passivation film 631 is also formed on the entire bottom face of the chip 602*c*.

In this way, by forming areas of the metal diffusion prevention film 622*e* and the passivation film 631 to be equal to each other and configuring the area of each of the metal diffusion prevention film 622*e* and of the passivation film 631 and the area of the charging film 612*e* to be different sizes, influences of stress and the like on the charging film 612*e* according to the metal diffusion prevention film 622*e* and the passivation film 631 can be reduced.

11th Embodiment

Figure 20:
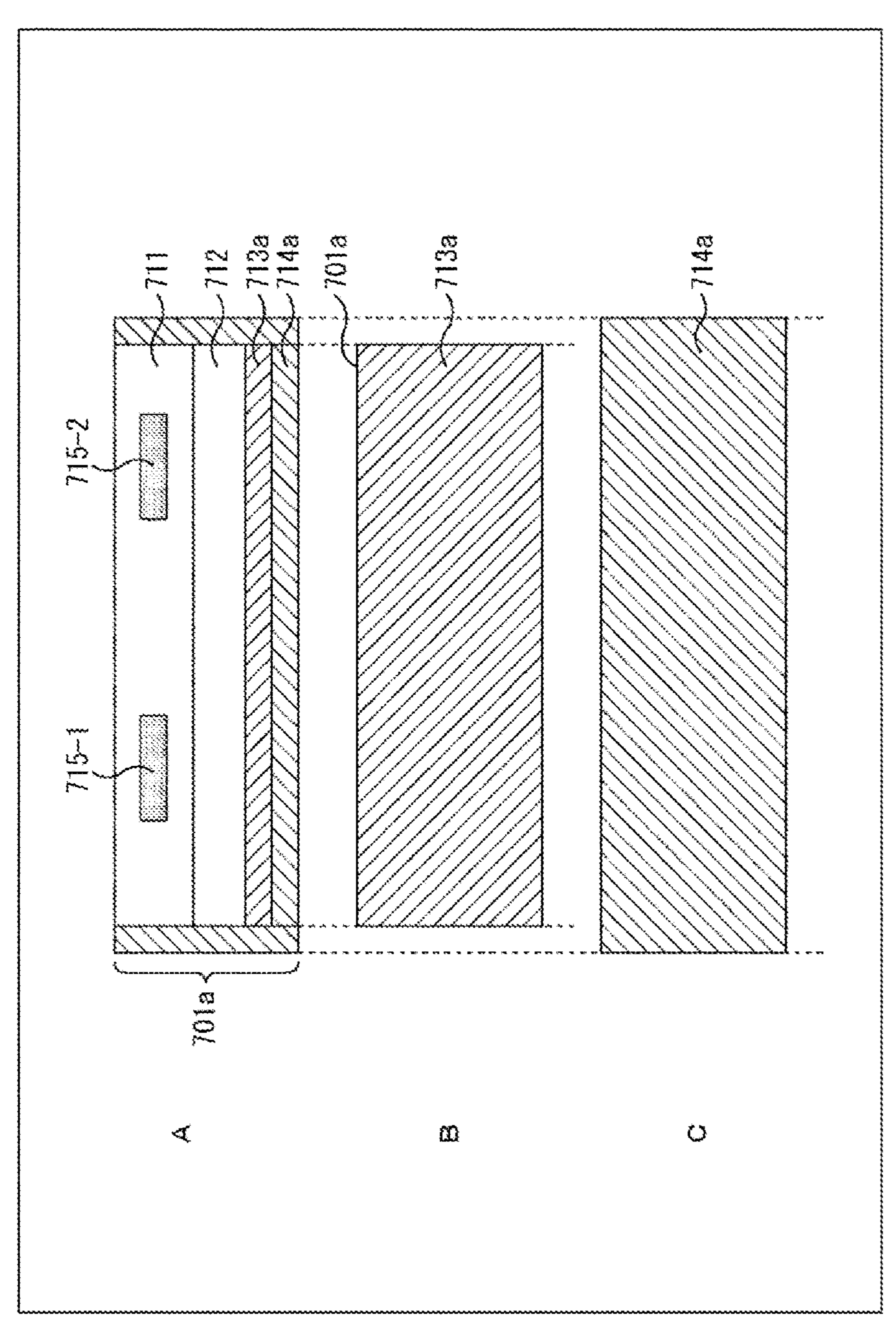
FIG. 20 is a diagram showing a configuration example of a chip according to an (11-1)-st embodiment.

FIG. 20 is a diagram showing a configuration example of a chip 701*a* according to an (11-1)-st embodiment. A of FIG. 20 shows a configuration example of a cross-section of the chip 701*a*, B of FIG. 20 shows a configuration example of a charging film 713*a* in the plan view of the chip 701*a*, and C of FIG. 20 shows a configuration example of a metal diffusion prevention film 714*a* in the plan view of the chip 701*a*. FIG. 20 shows a part of the chip 701*a*, and a stacked chip may be configured by stacking chips not shown in the drawing.

In the chip 701*a* shown in FIG. 20, a wiring layer 711, a silicon substrate 712, a charging film 713*a*, and a metal diffusion prevention film 714*a* are stacked. The metal diffusion prevention film 714*a* is a film that is disposed to cause metal composing a wiring 715-1 and a wiring 715-2 formed in a wiring layer 711 not to diffuse and is formed on a bottom face and a side face in the chip 701*a* shown in FIG. 20.

The chip 701*a* is manufactured by stacking the wiring layer 711 and the silicon substrate 712, stacking the charging film 713*a* on the stacked substrate, and forming the metal diffusion prevention film 714*a* on the bottom face and the side face after stacking the charging film 713*a*. Thus, as shown in FIG. 20, a configuration in which the charging film 713*a* and the metal diffusion prevention film 714*a* are stacked is formed.

In the example shown in FIG. 20, an area of the charging film 713*a* and an area of the metal diffusion prevention film 714*a* formed on the bottom face of the chip 701*a* (the silicon substrate 712) are formed with a size of the same degree as that of the bottom face of the chip 701*a*. In this way, the charging film 713*a* and the metal diffusion prevention film 714*a* can be formed with areas of the same degree.

Figure 21:
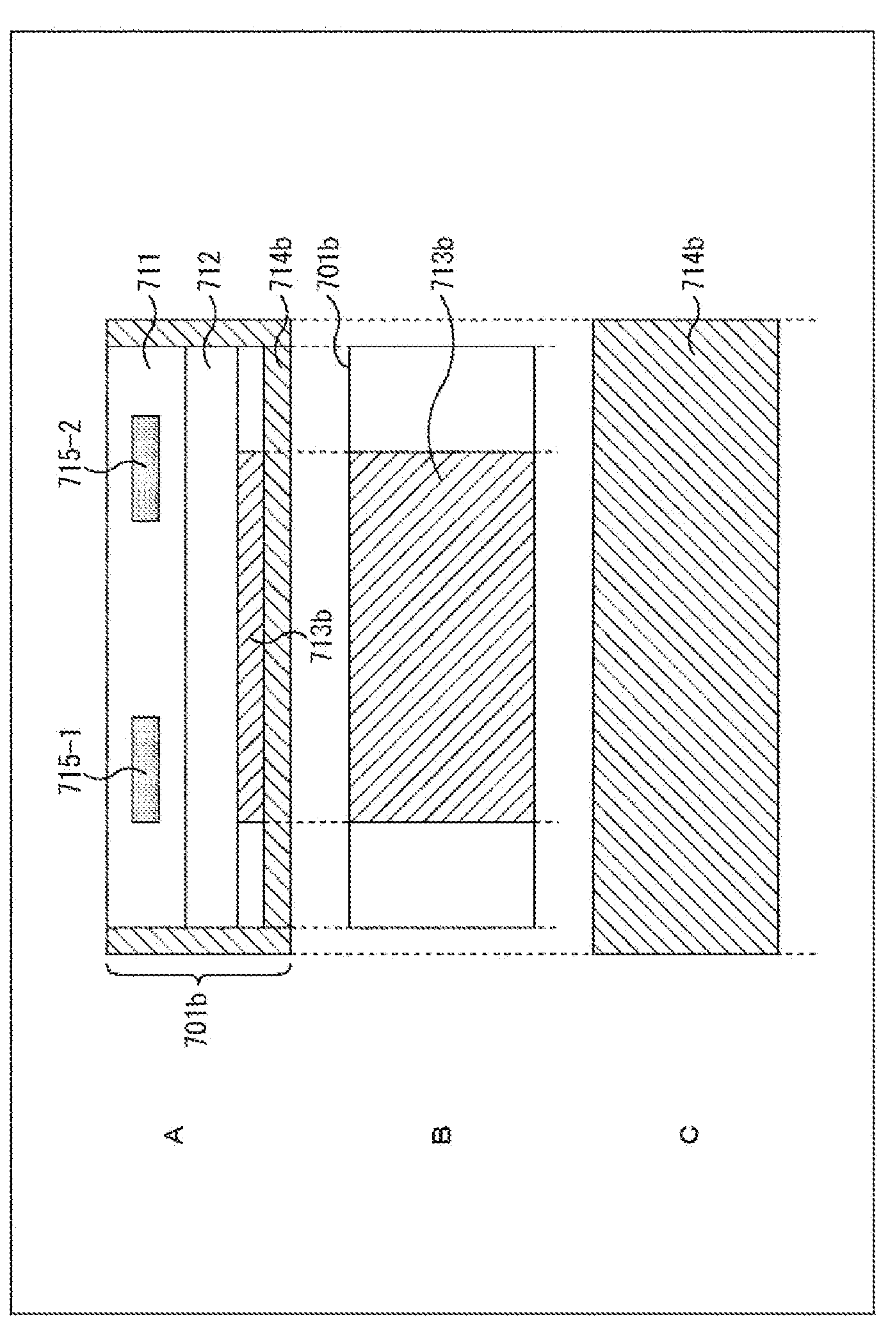
FIG. 21 is a diagram showing a configuration example of a chip according to a (11-2)-nd embodiment.

In a case in which the charging film 713*a* and the metal diffusion prevention film 714*a* are formed with areas of the same degree, and, for example, the influences of stress, heat, hydrogen, and the like on the charging film 713*a* according to the metal diffusion prevention film 714*a* are concerned, a configuration as shown in FIG. 21 may be employed.

(11-2)-nd Embodiment

FIG. 21 shows a configuration of a chip 701*b* according to a (11-2)-nd embodiment. A of FIG. 21 shows a configuration example of a cross-section of the chip 701*b*, B of FIG. 21 shows a configuration example of a charging film 713*b* in the plan view of the chip 701*b*, and C of FIG. 21 shows a configuration example of a metal diffusion prevention film 714*b* in the plan view of the chip 701*b*.

The charging film 713*b* of the chip 701*b* according to the (11-2)-nd embodiment is formed with an area different from that of the metal diffusion prevention film 714*b*, which is different from the charging film 713*b* of the chip 701*a* (FIG. 20) according to the (11-1)-st embodiment, and the other points are similar thereto.

The metal diffusion prevention film 714*b* of the chip 701*b* shown in FIG. 21 is formed on the entire face of the bottom face of the chip 701*b* (the silicon substrate 712). The charging film 713*b* is formed in a part of the bottom face of the chip 701*b*. In the example shown in FIG. 21, the charging film 713*b* is formed on the bottom face of the chip 701*b*. An area of this charging film 713*b* is smaller than an area of the bottom face of the chip 701*b* and is smaller than an area of the metal diffusion prevention film 714*b*.

In this way, by configuring the area of the charging film 713*b* and the area of the metal diffusion prevention film 714 with different sizes, influences of stress and the like on the charging film 713*a* according to the metal diffusion prevention film 714*a* can be reduced.

Although FIG. 21 shows an example in which the charging film 713*b* is formed at a center of the chip 701*b*, for example, as in the charging film 612*b* shown in FIG. 16, the charging film 713*b* may be disposed such that there is no area overlapping the wiring 715 in the plan view, or, as in the charging film 612*c* shown in FIG. 17, the charging film 713*b* may be disposed such that there is an area overlapping the wiring 715 in the plan view.

(11-3)-rd Embodiment

Figure 22:
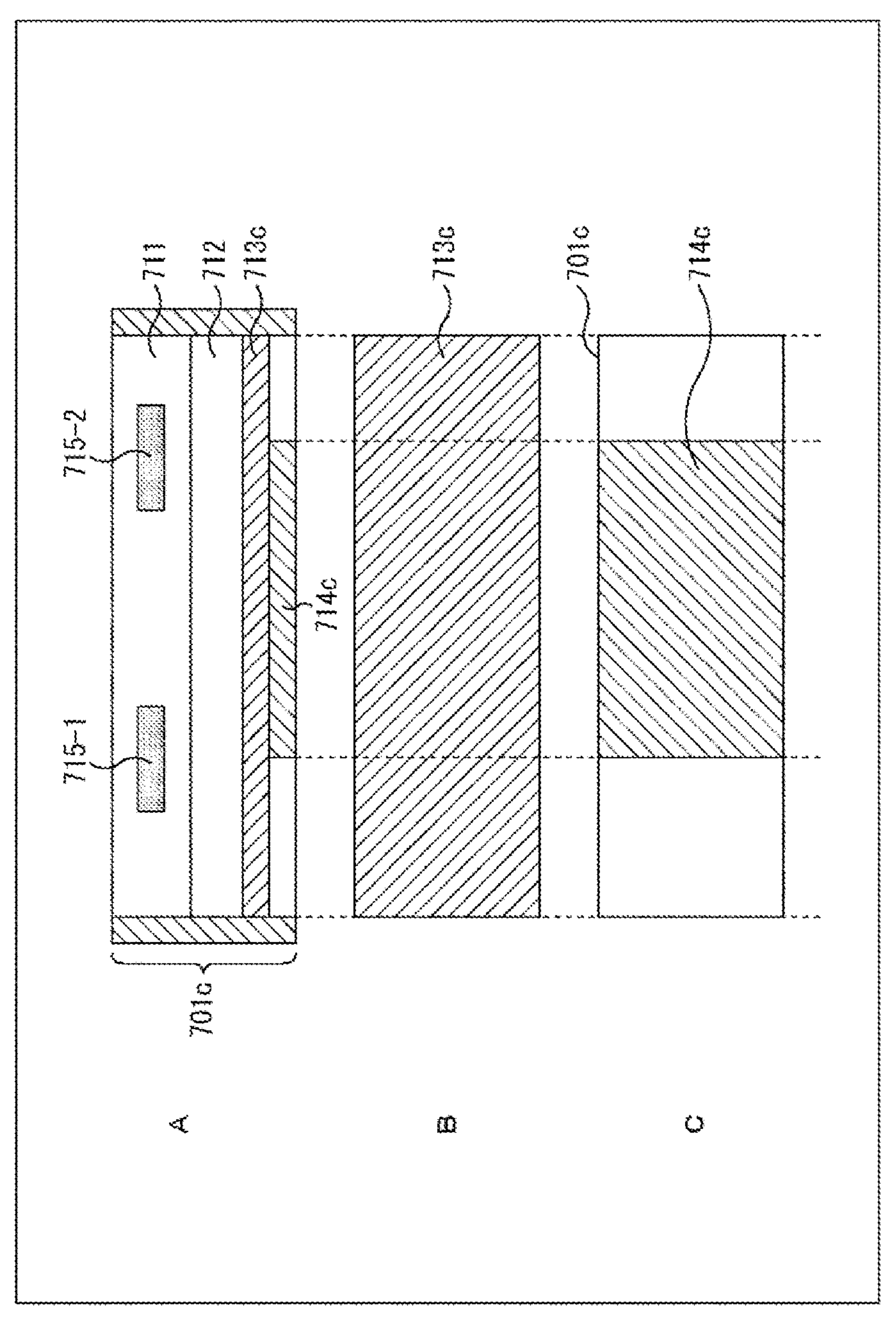
FIG. 22 is a diagram showing a configuration example of a chip according to a (11-3)-rd embodiment.

A configuration of a chip 701*c* according to an (11-3)-rd embodiment is shown in FIG. 22. A of FIG. 22 shows a configuration example of a cross-section of the chip 701*c*, B of FIG. 22 shows a configuration example of a charging film 713*c* in the plan view of the chip 701*c*, and C of FIG. 22 shows a configuration example of a metal diffusion prevention film 714*c* in the plan view of the chip 701*c*.

The metal diffusion prevention film 714*c* of the chip 701*c* according to the (11-3)-rd embodiment is formed with an area different from that of the charging film 713*c*, which is different from the metal diffusion prevention film 714*a* of the chip 701*a* (FIG. 20) according to the (11-1)-st embodiment, and the other points are similar thereto.

The charging film 713*c* of the chip 701*c* shown in FIG. 22 is formed on the entire face of the bottom face of the chip 701*c*. The metal diffusion prevention film 714*c* is formed in a part of the bottom face of the chip 701*c*. In the example shown in FIG. 22, the metal diffusion prevention film 714*a* is formed at the center of the bottom face of the chip 701*c*. An area of this metal diffusion prevention film 714*a* is smaller than an area of the bottom face of the chip 701*c* and is smaller than an area of the charging film 713*c*.

In this way, by configuring the area of the charging film 713*c* and the area of the metal diffusion prevention film 714*c* with different sizes, influences of stress and the like on the charging film 713*c* according to the metal diffusion prevention film 714*c* can be reduced.

<Application to Endoscope Surgery System>

The technology according to the present disclosure (the present technology) can be applied to various products. For example, the technology according to the present disclosure may be applied to an endoscope surgery system.

Figure 23:
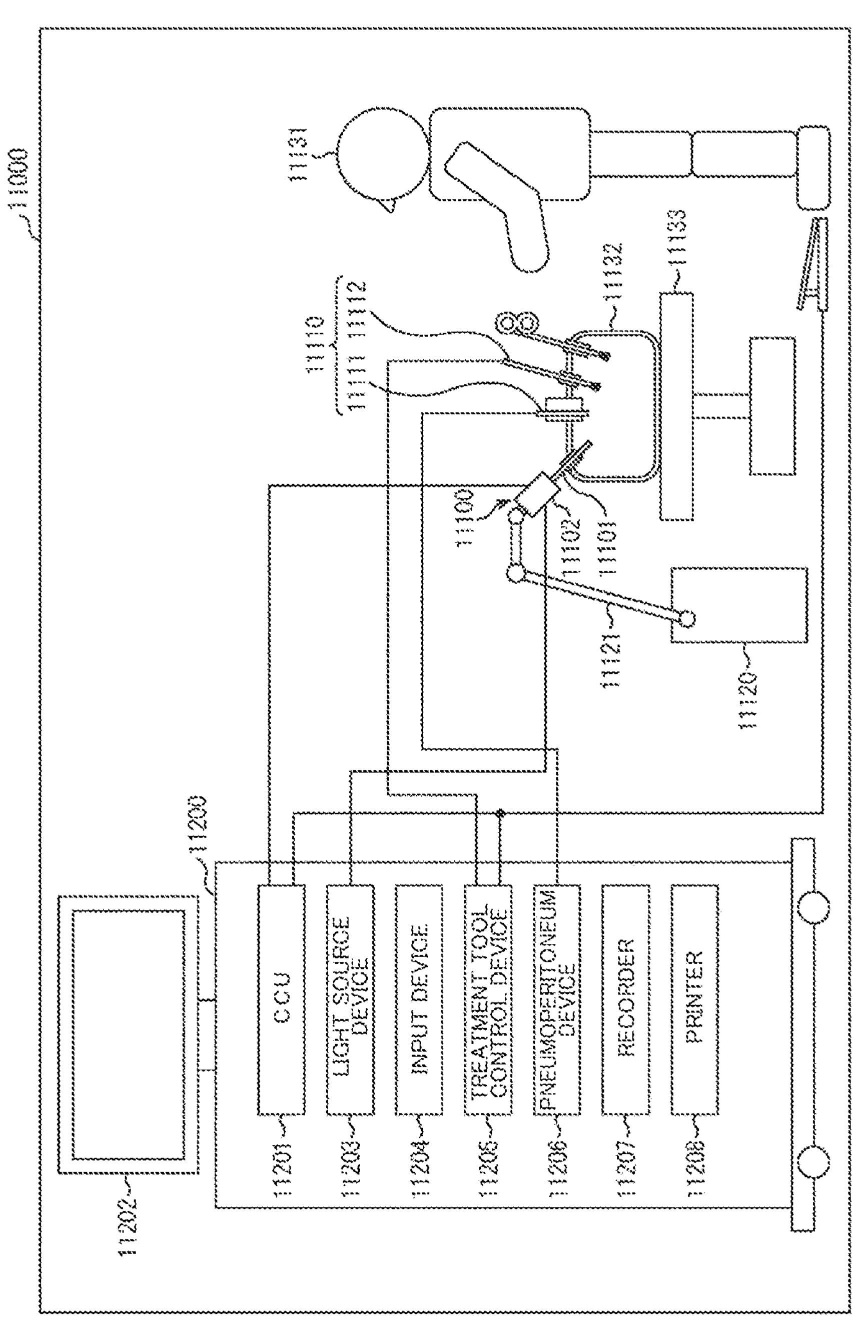
FIG. 23 is a diagram showing one example of a schematic configuration of an endoscope surgery system.

FIG. 23 is a diagram illustrating an example of a schematic configuration of an endoscope surgery system to which the technology according to the present disclosure (the present technology) is applied.

FIG. 23 shows a state where a surgeon (doctor) 11131 is performing a surgical operation on a patient 11132 on a patient bed 11133 by using the endoscope surgery system 11000. As illustrated, the endoscope surgery system 11000 includes an endoscope 11100, other surgery tools 11110 such as a pneumoperitoneum tube 11111 or an energy treatment tool 11112, a support arm device 11120 supporting the endoscope 11100, and a cart 11200 on which various devices for an endoscope surgery are mounted.

The endoscope 11100 includes a body tube 11101 of which a region with a predetermined length is inserted from a distal end into a body cavity of the patient 11132 and a camera head 11102 connected to a base end of the body tube 11101. In the illustrated example, the endoscope 11100 configured as a so-called hard mirror having a hard body tube 11101 is illustrated, but the endoscope 11100 may be configured as a so-called soft mirror having a soft body tube.

At the distal end of the body tube 11101, an opening into which an objective lens is inserted is provided. A light source device 11203 is connected to the endoscope 11100, light generated by the light source device 11203 is guided to the distal end of the body tube by a light guide extended to the inside of the body tube 11101, and the light is radiated to an observation target in the body cavity of the patient 11132 through the objective lens. The endoscope 11100 may be a direct-viewing mirror, an oblique-viewing mirror, or a side-viewing mirror.

An optical system and an imaging element are provided inside the camera head 11102 and light (observation light) reflected from the observation target is condensed on the imaging element by the optical system. The observation light is photoelectrically converted by the imaging element and an electric signal corresponding to the observation light, that is, an image signal corresponding to an observation image, is generated. The image signal is transmitted to a camera control unit (CCU) 11201 as RAW data.

The CCU 11201 is configured by a central processing unit (CPU), a graphics processing unit (GPU), or the like and generally controls operations of the endoscope 11100 and the display device 11202. Further, the CCU 11201 receives an image signal from the camera head 11102 and performs, for example, various kinds of image processing such as a developing process (demosaic processing) on the image signal to display an image based on the image signal.

The display device 11202 displays an image based on an image signal having been subjected to image processing by the CCU 11201 under the control of the CCU 11201.

The light source device 11203 is configured by, for example, a light source such as a light emitting diode (LED) and supplies the endoscope 11100 with irradiation light at the time of imaging of an operation part or the like.

The input device 11204 is an input interface for the endoscope surgery system 11000. A user can input various kinds of information or instructions to the endoscope surgery system 11000 through the input device 11204. For example, the user inputs an instruction or the like to change imaging conditions (a kind of irradiation light, a magnification, a focal distance, and the like) for the endoscope 11100.

A treatment tool control device 11205 controls driving of the energy treatment tool 11112 for tissue cautery or incision, blood vessel sealing, or the like. A pneumoperitoneum device 11206 sends a gas into the body cavity via the pneumoperitoneum tube 11111 to inflate the body cavity of the patient 11132 in order to guarantee a visual field for the endoscope 11100 and guarantee a working space of the operator. A recorder 11207 is a device capable of recording various kinds of information regarding surgery. A printer 11208 is a device capable of printing various kinds of information regarding surgery in various forms of text, images, graphs, or the like.

The light source device 11203 that supplies the endoscope 11100 with irradiation light at the time of imaging of an operation part can be configured by, for example, an LED, a laser light source, or a white light source configured in combination thereof. When the white light source is configured in combination of an RGB laser light source, an output intensity and an output timing of each color (each wavelength) can be controlled with high accuracy. Therefore, the light source device 11203 can adjust white balance of a captured image. In this case, by time-divisionally irradiating an observation target with laser light from the RGB laser light source and controlling driving of the imaging element of the camera head 11102 in synchronization with the irradiation timing, it is also possible to time-divisionally capture images corresponding to RGB. According to this method, it is possible to obtain a color image even when color filters are not provided in the imaging element.

The driving of the light source device 11203 may be controlled such that the intensity of light to be output is changed at each predetermined time. By controlling the driving of the imaging element of the camera head 11102 in synchronization with a change timing of the intensity of the light, time-divisionally acquiring images, and combining the images, it is possible to generate an image with a high dynamic range in which there is no so-called black spots and white spots.

The light source device 11203 may be configured to be able to supply light with a predetermined wavelength band corresponding to special light observation. In the special light observation, for example, so-called narrow band observation (narrow band imaging) is performed for imaging a predetermined tissue such as a blood vessel of a mucous membrane surface with high contrast by radiating light with a narrower band than the irradiation light (that is, white light) at the time of normal observation using wavelength dependency of light absorption in a body tissue. Alternatively, in the special light observation, fluorescence observation may be performed for obtaining an image by fluorescence occurring by radiating exciting light. In the fluorescence observation, for example, a body tissue can be irradiated with exciting light and fluorescence from the body tissue can be observed (self-fluorescence observation), or a reagent such as indocyanine green (ICG) can be locally injected into a body tissue and the body tissue can be irradiated with exciting light corresponding to the fluorescence wavelength of the reagent to obtain a fluorescent image. The light source device 11203 can be configured to be able to supply exciting light and/or narrow-band light corresponding to the special light observation.

Figure 24:
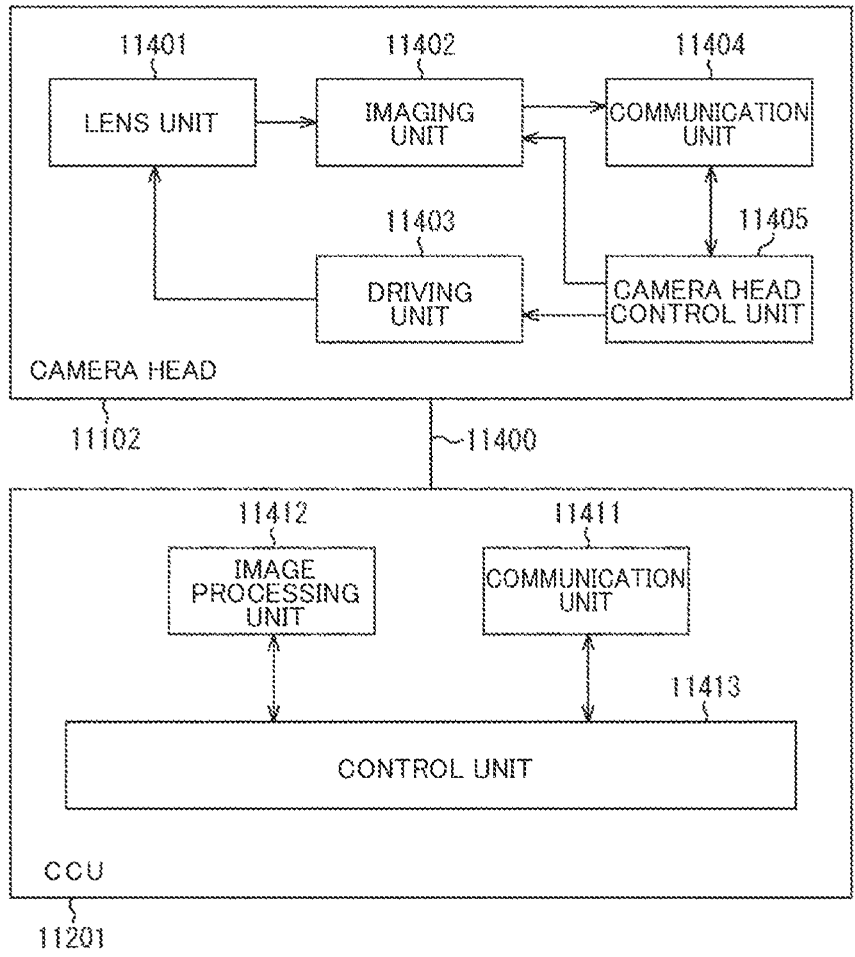
FIG. 24 is a block diagram showing an example of a functional configuration of a camera head and a CCU.

FIG. 24 is a block diagram illustrating an example of a functional configuration of the camera head 11102 and the CCU 11201 illustrated in FIG. 23.

The camera head 11102 has a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are connected to be able to communicate with each other via a transmission cable 11400.

The lens unit 11401 is an optical system provided in a connection unit with the body tube 11101. Observation light received from the distal end of the body tube 11101 is guided to the camera head 11102 and is incident on the lens unit 11401. The lens unit 11401 is configured to a plurality of lenses including a zoom lens and a focus lens in combination.

The number of imaging elements that configure the imaging unit 11402 may be singular (so-called single-plate) or may be multiple (so-called multiple-plate). When the imaging unit 11402 is configured as a multiple-plate, for example, an image signal corresponding to each of RGB may be generated by each imaging element and a color image may be able to be obtained by combining the image signals. Alternatively, the imaging unit 11402 may include a pair of imaging elements to acquire right-eye and left-eye image signals corresponding to 3-dimensional (3D) display. By performing the 3D display, the operator 11131 can ascertain the depth of a body tissue in an operation part more accurately. When the imaging unit 11402 is configured as a multiple-plate, a plurality of systems of the lens unit 11401 may be provided to correspond to each imaging element.

The imaging unit 11402 may not necessarily be provided in the camera head 11102. For example, the imaging unit 11402 may be provided immediately behind the objective lens inside the body tube 11101.

The drive unit 11403 is configured by an actuator and the zoom lens and the focus lens of the lens unit 11401 are moved by a predetermined distance along an optical axis under the control of the camera head control unit 11405. In this way, it is possible to appropriately adjust the magnification and focus of a captured image by the imaging unit 11402.

The communication unit 11404 is configured using a communication device for transmitting or receiving various information to or from the CCU 11201. The communication unit 11404 transmits an image signal obtained from the imaging unit 11402 to the CCU 11201 as raw data via the transmission cable 11400.

The communication unit 11404 receives a control signal for controlling driving of the camera head 11102 from the CCU 11201 and supplies the control signal to the camera head control unit 11405. The control signal includes, for example, information regarding imaging conditions such as information indicating designation of a frame rate of a captured image, information indicating designation of an exposure value at the time of imaging, and/or information indicating designation of the magnification and focus of the captured image.

Imaging conditions such as the foregoing frame rate, exposure value, magnification, and focus may be designated appropriately by the user or may be set automatically by the control unit 11413 of the CCU 11201 based on the acquired image signal. In the latter case, a so-called auto exposure (AE) function, auto focus (AF) function, and auto white balance (AWB) function are mounted on the endoscope 11100.

The camera head control unit 11405 controls the driving of the camera head 11102 on the basis of the control signal from the CCU 11201 received via the communication unit 11404.

The communication unit 11411 is configured by a communication device that transmits and receives various kinds of information to and from the camera head 11102. The communication unit 11411 receives an image signal transmitted via the transmission cable 11400 from the camera head 11102.

In addition, the communication unit 11411 transmits a control signal for controlling the driving of the camera head 11102 to the camera head 11102. The image signal or the control signal can be transmitted through electric communication, optical communication, or the like.

The image processing unit 11412 applies various kinds of image processing to the image signal which is the raw data transmitted from the camera head 11102.

The control unit 11413 performs various kinds of control on display of a captured image obtained through imaging of an operation part or the like or imaging of an operation part or the like by the endoscope 11100. For example, the control unit 11413 generates a control signal for controlling driving of the camera head 11102.

The control unit 11413 causes the display device 11202 to display the captured image in which the operation part or the like is shown based on the image signal subjected to the image processing in the image processing unit 11412. At this time, the control unit 11413 may recognize various objects in the captured image using various image recognition technologies. For example, the control unit 11413 can recognize a surgery tool such as forceps, a specific biological part, bleeding, or mist or the like at the time of use of the energy treatment tool 11112 by detecting the shape, color, or the like of the edge of an object included in the captured image.

The control unit 11413 may superimpose various kinds of surgery support information on the image of the operation part for display using the recognition result when the display device 11202 is caused to display the captured image. By superimposing and displaying the surgery support information and presenting the surgery support information to the operator 11131, it is possible to reduce a burden on the operator 11131 or allow the operator 11131 to perform an operation reliably.

The transmission cable 11400 connecting the camera head 11102 and the CCU 11201 to each other is an electric signal cable that supports electric signal communication, an optical fiber that supports optical communication, or a composite cable thereof.

Here, in the example shown in the drawing, communication is performed in a wired manner using the transmission cable 11400, but communication between the camera head 11102 and the CCU 11201 may be performed in a wireless manner.

<Application to Mobile Object>

The technology of the present disclosure (the present technology) can be applied to various products. For example, the technology of the present disclosure may be implemented as a device mounted in any type of mobile object such as an automobile, an electric automobile, a hybrid electric automobile, a motorbike, a bicycle, a personal mobility, an airplane, a drone, a ship, and a robot.

Figure 25:
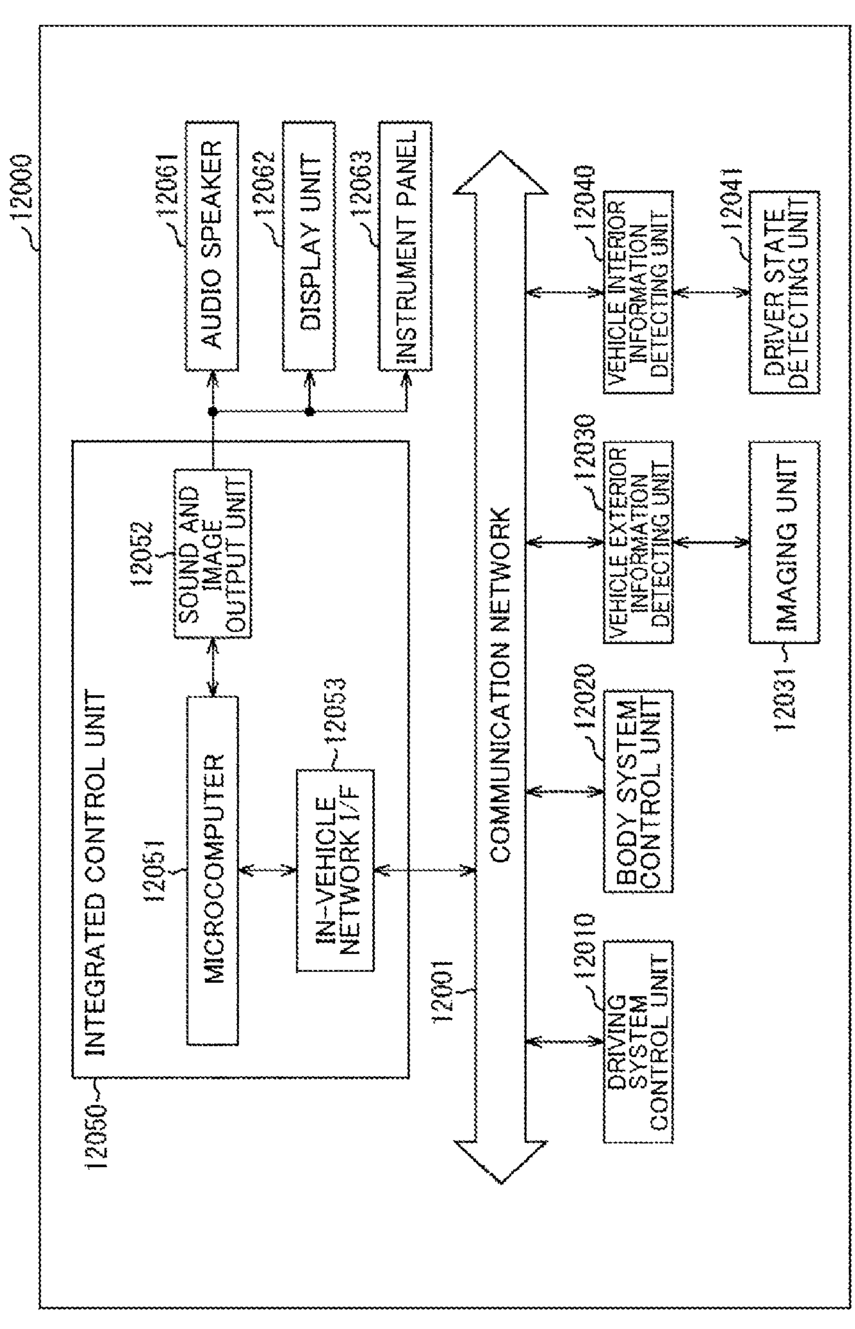
FIG. 25 is a block diagram showing an example of a schematic configuration of a vehicle control system.

FIG. 25 is a block diagram illustrating an example of an overall configuration of a vehicle control system which is an example of a mobile object control system to which the technology of the present disclosure can be applied.

A vehicle control system 12000 includes a plurality of electronic control units connected to each other via a communication network 12001. In the example illustrated in FIG. 25, the vehicle control system 12000 includes a drive system control unit 12010, a body system control unit 12020, a vehicle exterior information detecting unit 12030, a vehicle interior information detecting unit 12040, and an integrated control unit 12050. In addition, as a functional configuration of the integrated control unit 12050, a microcomputer 12051, an audio/image output unit 12052, and an in-vehicle network interface (I/F) 12053 are illustrated.

The drive system control unit 12010 controls an operation of a device related to a drive system of a vehicle according to various programs. For example, the drive system control unit 12010 functions as a driving force generator for generating a driving force of a vehicle such as an internal combustion engine or a driving motor, a driving force transmission mechanism for transmitting a driving force to wheels, a steering mechanism for adjusting a turning angle of a vehicle, and a control device such as a braking device that generates a braking force of a vehicle.

The body system control unit 12020 controls operations of various devices equipped in a vehicle body in accordance with various programs. For example, the body system control unit 12020 functions as a control device of a keyless entry system, a smart key system, a power window device, or various lamps such as a head lamp, a back lamp, a brake lamp, a turn signal, or a fog lamp. In this case, radio waves transmitted from a portable device that substitutes for a key or signals of various switches can be input to the body system control unit 12020. The body system control unit 12020 receives inputs of these radio waves or signals and controls a door lock device, a power window device, a lamp, and the like of the vehicle.

The vehicle exterior information detecting unit 12030 detects information on the outside of the vehicle having the vehicle control system 12000 mounted thereon. For example, an imaging unit 12031 is connected to the vehicle exterior information detecting unit 12030. The vehicle exterior information detecting unit 12030 causes the imaging unit 12031 to capture an image outside the vehicle and receives the captured image. The vehicle exterior information detecting unit 12030 may perform object detection processing or distance detection processing for people, cars, obstacles, signs, and letters on a road on the basis of the received image.

The imaging unit 12031 is an optical sensor that receives light and outputs an electrical signal according to the amount of received light. The imaging unit 12031 can also output the electrical signal as an image and ranging information. In addition, light received by the imaging unit 12031 may be visible light, or may be invisible light such as infrared light.

The vehicle interior information detecting unit 12040 detects information inside the vehicle. For example, a driver state detecting unit 12041 that detects a state of a driver is connected to the vehicle interior information detecting unit 12040. The driver state detecting unit 12041 includes, for example, a camera that captures an image of the driver, and the vehicle interior information detecting unit 12040 may calculate a degree of fatigue or concentration of the driver or may determine whether or not the driver is dozing on the basis of detection information input from the driver state detecting unit 12041.

The microcomputer 12051 can calculate a control target value of the driving force generation device, the steering mechanism, or the braking device on the basis of information inside and outside the vehicle acquired by the vehicle exterior information detecting unit 12030 or the vehicle interior information detecting unit 12040, and output a control command to the drive system control unit 12010. For example, the microcomputer 12051 can perform coordinated control for the purpose of realizing a function of an advanced driver assistance system (ADAS) including vehicle collision avoidance, shock alleviation, following travel based on an inter-vehicle distance, vehicle speed maintaining drive, vehicle collision warning, vehicle lane departure warning, or the like.

Further, the microcomputer 12051 can perform cooperative control for the purpose of automated driving or the like in which autonomous travel is performed without depending on operations of the driver by controlling the driving force generation device, the steering mechanism, the braking device, and the like on the basis of information regarding the surroundings of the vehicle acquired by the vehicle exterior information detecting unit 12030 or the vehicle interior information detecting unit 12040.

In addition, the microcomputer 12051 can output a control command to the body system control unit 12030 based on the information outside the vehicle acquired by the vehicle exterior information detecting unit 12030. For example, the microcomputer 12051 can perform coordinated control for the purpose of antiglare such as switching a high beam to a low beam by controlling a headlamp according to a position of a preceding vehicle or an oncoming vehicle detected by the vehicle exterior information detecting unit 12030.

The audio/image output unit 12052 transmits an output signal of at least one of audio and an image to an output device capable of visually or audibly notifying a passenger or the outside of the vehicle of information. In the example illustrated in FIG. 25, an audio speaker 12061, a display unit 12062, and an instrument panel 12063 are illustrated as output devices. The display unit 12062 may include, for example, at least one of an onboard display and a head-up display.

Figure 26:
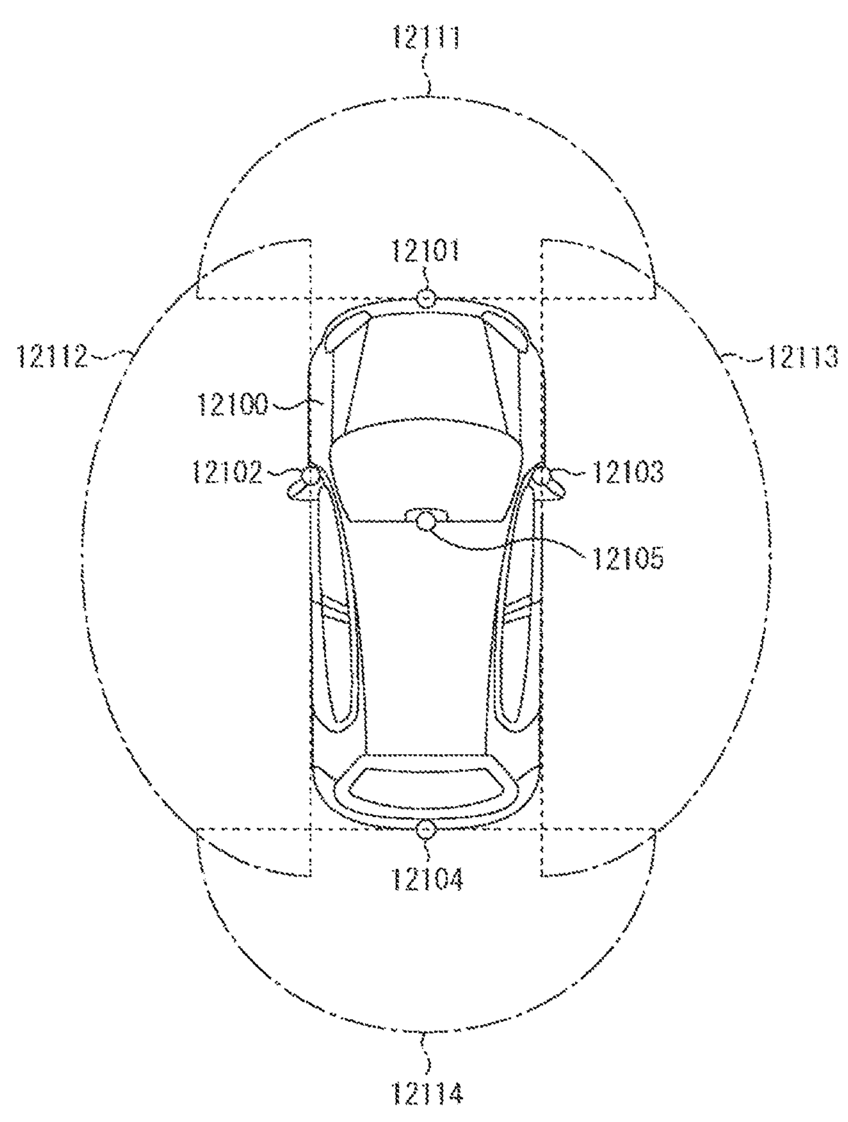
FIG. 26 is an explanatory diagram showing an example of installation positions of a vehicle exterior information detecting unit and an imaging unit.

FIG. 26 is a diagram illustrating an example of positions at which the imaging unit 12031 is installed.

In FIG. 26, imaging units 12101, 12102, 12103, 12104, and 12105 are included as the imaging unit 12031.

The imaging units 12101, 12102, 12103, 12104, and 12105 are provided at, for example, positions of a front nose, side mirrors, a rear bumper, a back door, an upper portion of a vehicle interior front windshield, and the like of a vehicle 12100. The imaging unit 12101 provided on a front nose and the imaging unit 12105 provided in an upper portion of the vehicle interior front windshield mainly acquire images in front of the vehicle 12100. The imaging units 12102 and 12103 provided on the side mirrors mainly acquire images on the lateral side of the vehicle 12100. The imaging unit 12104 provided on the rear bumper or the back door mainly acquires images in the rear of the vehicle 12100. The imaging unit 12105 provided on the upper portion of the vehicle interior front windshield is used to mainly detect preceding vehicles, pedestrians, obstacles, traffic signals, traffic signs, lanes, or the like.

Meanwhile, FIG. 26 illustrates an example of imaging ranges of the imaging units 12101 to 12104. An imaging range 12111 indicates an imaging range of the imaging unit 12101 provided at the front nose, imaging ranges 12112 and 12113 respectively indicate imaging ranges of the imaging units 12102 and 12103 provided at the side mirrors, and an imaging range 12114 indicates an imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function for acquiring distance information. For example, at least one of the imaging units 12101 to 12104 may be a stereo camera constituted by a plurality of imaging elements or may be an imaging element having pixels for phase difference detection.

For example, the microcomputer 12051 can extract a 3-dimensional object traveling at a predetermined speed (for example, 0 km/h or more) in substantially the same direction as the vehicle 12100, particularly a closest 3-dimensional object on a travel road of the vehicle 12100 as a preceding vehicle by obtaining a distance to each 3-dimensional object in the imaging ranges 12111 to 12114 and a change (a relative speed to the vehicle 12100) in the distance over time based on distance information obtained from the imaging units 12101 to 12104. Further, the microcomputer 12051 can set an inter-vehicle distance which should be guaranteed in advance in front of a preceding vehicle and can perform automated brake control (also including following stop control) or automated acceleration control (also including following start control). In this way, it is possible to perform coordinated control in order to perform automated driving or the like in which a vehicle autonomously travels irrespective of a manipulation of a driver.

For example, the microcomputer 12051 can classify and extract 3-dimensional data regarding 3-dimensional objects into other 3-dimensional objects such as a two-wheeled vehicle, a normal vehicle, a large vehicle, a pedestrian, and an electric pole based on distance information obtained from the imaging units 12101 to 12104 and can use the other 3-dimensional objects to perform automated avoidance of obstacles. For example, the microcomputer 12051 identifies surrounding obstacles of the vehicle 12100 as obstacles which can be viewed by the driver of the vehicle 12100 and obstacles which are difficult to view. Then, the microcomputer 12051 determines a collision risk indicating the degree of risk of collision with each obstacle, and when the collision risk is equal to or higher than the set value and there is a possibility of collision, an alarm is output to the driver through the audio speaker 12061 and the display unit 12062, forced deceleration and avoidance steering are performed through the drive system control unit 12010, and thus it is possible to perform driving support for collision avoidance.

At least one of the imaging units 12101 to 12104 may be an infrared camera that detects infrared rays. For example, the microcomputer 12051 can recognize a pedestrian by determining whether there is a pedestrian in the captured image of the imaging units 12101 to 12104. Such pedestrian recognition is performed by, for example, a procedure in which feature points in the captured images of the imaging units 12101 to 12104 as infrared cameras are extracted and a procedure in which pattern matching processing is performed on a series of feature points indicating the outline of the object and it is determined whether the object is a pedestrian. When the microcomputer 12051 determines that there is a pedestrian in the captured images of the imaging units 12101 to 12104, and the pedestrian is recognized, the audio/image output unit 12052 controls the display unit 12062 so that the recognized pedestrian is superimposed and displayed with a square contour line for emphasis. In addition, the audio/image output unit 12052 may control the display unit 12062 so that an icon indicating a pedestrian or the like is displayed at a desired position.

The system as used herein refers to an entire device configured by a plurality of devices.

The advantageous effects described in the present specification are merely exemplary and are not limited, and other advantageous effects may be achieved.

Embodiments of the present technology are not limited to the above-described embodiments and various modifications can be made within the scope of the present technology without departing from the gist of the present technology.

The present technology can also be configured as follows.

(1)

An imaging element in which: a first chip including a photo diode;

and a second chip including a circuit processing a signal transmitted from the photo diode are stacked, and a charging film is disposed on a second face of the second chip that is on a side opposite to a first face on which the first chip is stacked.

(2)

The imaging element described in (1) described above, in which the charging film is disposed in a part or the entirety of the second face.

(3)

The imaging element described in (1) or (2) described above, in which the charging film is disposed also on a side face of the second chip.

(4)

The imaging element described in any one of (1) to (3) described above, in which the charging film is a film having negative or positive fixed electric charge.

(5)

The imaging element described in (4) described above, in which the charging film is formed of hafnium oxide, aluminum oxide, zirconium oxide, tantalum oxide, titanium oxide, lanthanum oxide, or yttrium oxide.

(6)

The imaging element described in (5) described above, in which a part of the charging film is nitrided.

(7)

The imaging element described in any one of (1) to (3) described above, in which the charging film is formed using a ferroelectric substance.

(8)

The imaging element described in (7) described above, in which the charging film is formed of gallium nitride, barium titanate, zinc oxide, or aluminum nitride.

(9)

The imaging element described in any one of (1) to (8) described above, in which the charging film is formed in a single layer or multiple layers.

(10)

The imaging element described in any one of (1) to (9) described above, in which a charging film having different characteristics is disposed on the second face.

(11)

The imaging element described in any one of (1) to (10) described above, in which a thickness of the second chip is equal to or smaller than 20 um.

(12)

The imaging element described in any one of (1) to (11) described above, in which a third chip is further stacked on the second chip.

(13)

The imaging element described in any one of (1) to (12) described above, in which two or more second chips are disposed in the first chip.

(14)

The imaging element described in any one of (1) to (13) described above further including a metal diffusion prevention film, in which an area in which the metal diffusion prevention film is formed and an area in which the charging film is formed are of different sizes.

(15)

A semiconductor chip that is a chip of which a thickness is equal to or smaller than 20 um, in which a charging film is disposed on a predetermined face of the chip.

(16)

The semiconductor chip described in (15) described above, in which a plurality of chips including the semiconductor chip are stacked, and a charging film is disposed in at least one chip among the plurality of chips.

(17)

The semiconductor chip described in (15) or (16) described above, in which the semiconductor chip is a chip in which a memory or a logic circuit is mounted.

(18)

An imaging element in which: a first chip including a photo diode;

a second chip including a circuit processing a signal transmitted from the photo diode; and a third chip having a memory function or an AI function are stacked, in which a charging film is disposed on a second face of the third chip that is on a side opposite to a first face on which the second chip is stacked.

(19)

The imaging element described in (18) described above, in which a charging film is disposed on a fourth face of the second chip that is on a side opposite to a third face on which the first chip is stacked.

REFERENCE SIGNS LIST

10 Imaging device
11 Lens group
12 Imaging element
13 DSP circuit
14 Frame memory
15 Display unit
16 Recording unit
17 Operation system
18 Power supply system
19 Bus line
20 CPU
41 Pixel array unit
42 Vertical drive unit
43 Column processing unit
44 Horizontal drive unit
45 System control unit
46 Pixel drive line
47 Vertical signal line
48 Signal processing unit
49 Data storage unit
101 CIS chip
102 Logic chip
103 Support base
104 Gate formation layer
105 Source/drain formation layer
111 On-chip lens
112 Color filter
113 Photo diode
114 Wiring layer

115 Pad
121 Pad
122 Wiring
123 Transistor
130 Charging film
151 P well
152 N well
153 Diffusion layer
154 Diffusion layer
155 Element separation area
161 Depletion layer
162 Defect
201 Oxide film
251 Chip
252 Charging film
253 Oxide film
301 Stacked chip
311 Memory chip
330 Charing film
351 Monolithic device
401 Chip
402 Chip
403 Chip
404 Support base
412 Bump
414 Bump
501 Single-layer chip

What is claimed is:

1. An imaging device, comprising:

a first substrate, including:

a first semiconductor substrate;

a first multi-layer wiring layer stacked on the first semiconductor substrate; and a first pad included in the first multi-layer wiring layer;

a second substrate, including:

a second semiconductor substrate;

a second multi-layer wiring layer stacked on a first side of the second semiconductor substrate;

a second pad included in the second multi-layer wiring layer; and a third pad disposed on a second side of the second substrate that is opposite to the first side of the second semiconductor substrate;

a third substrate, including:

a third semiconductor substrate;

a third multi-layer wiring layer stacked on the third semiconductor substrate; and a fourth pad included in the third multi-layer wiring layer, wherein the first substrate and the second substrate are electrically connected through a direct bonding between the first pad and the second pad, and wherein the second substrate and the third substrate are electrically connected through a direct bonding between the third pad and the fourth pad;

a through via that electrically connects the second multi-layer wiring layer and the third pad;

a first film including a metal disposed on a second side of the second semiconductor substrate, wherein the first film forms a Hall accumulation layer, and wherein at least a portion of the first film is disposed between the third pad and the third semiconductor substrate; and an oxide film, wherein the oxide film is disposed between the third substrate and the first film, and wherein the through via extends through the second semiconductor substrate and through an entire thickness of the first film.

2. The imaging device according to claim 1, wherein the first substrate includes a plurality of photodiodes.

3. The imaging device according to claim 1, wherein the second substrate includes a first circuit.

4. The imaging device according to claim 3, wherein the third substrate includes a second circuit.

5. The imaging device according to claim 1, wherein the second substrate is stacked on the first substrate such that the first multi-layer wiring layer and the second multi-layer wiring layer are opposed to each other.

6. The imaging device according to claim 5, wherein the second multi-layer wiring layer includes a first wiring, and the second pad is connected to the first wiring by a first via.

7. The imaging device according to claim 6, wherein the through via electrically connects a second wiring and the third pad, and wherein the second wiring is disposed in a different layer in the second multi-layer wiring layer than the first wiring.

8. The imaging device according to claim 7, wherein the third multi-layer wiring layer includes a third wiring, and the third pad is connected to the third wiring by a second via.

9. The imaging device according to claim 1, wherein the second substrate further includes a second film on the second side of the second semiconductor substrate.

10. The imaging device according to claim 9, wherein the second film includes SiN, SiO2 or SiON.

11. The imaging device according to claim 1, wherein the first film includes at least one of hafnium, aluminum, zirconium, tantalum, titanium, lanthanum or ittorium.

12. The imaging device according to claim 1, wherein the first film includes at least one of an oxide of hafnium, aluminum, zirconium, tantalum, titanium, lanthanum or yttrium.

13. The imaging device according to claim 1, wherein the first film includes at least tantalum.

14. The imaging device according to claim 1, wherein the first film has one of a negative fixed charge or a positive fixed charge.

15. The imaging device according to claim 1, further comprising:

a charging film disposed on a surface of the third semiconductor substrate.

16. The imaging device according to claim 1, wherein the third pad is formed in the oxide film.

* * * * *